(12) United States Patent
Matsumoto et al.

(10) Patent No.: US 7,508,291 B2
(45) Date of Patent: Mar. 24, 2009

(54) INDUCTOR ELEMENT AND INTEGRATED ELECTRONIC COMPONENT

(75) Inventors: Tsuyoshi Matsumoto, Kawasaki (JP); Xiaoyu Mi, Kawasaki (JP); Yoshihiro Mizuno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/892,451

(22) Filed: Aug. 23, 2007

(65) Prior Publication Data
US 2008/0048816 A1    Feb. 28, 2008

(30) Foreign Application Priority Data
Aug. 28, 2006    (JP)    ............... 2006-230539

(51) Int. Cl.
H01F 5/00    (2006.01)
(52) U.S. Cl. .................................... 336/200
(58) Field of Classification Search ............. 336/83, 336/200, 206–208, 232; 531/528–531
See application file for complete search history.

(56) References Cited

U.S. PATENT DOCUMENTS

| | | | |
|---|---|---|---|
| 5,370,766 A | 12/1994 | Desaigoudar et al. | |
| 5,420,558 A | 5/1995 | Ito et al. | |
| 5,572,179 A | 11/1996 | Ito et al. | |
| 6,489,663 B2 * | 12/2002 | Ballantine et al. | 257/531 |
| 6,661,078 B2 * | 12/2003 | Shitara | 257/528 |
| 7,145,428 B2 * | 12/2006 | Chiu | 336/200 |
| 2005/0184358 A1 * | 8/2005 | Lin | 257/531 |
| 2007/0045773 A1 | 3/2007 | Mi et al. | |

FOREIGN PATENT DOCUMENTS

| | | |
|---|---|---|
| JP | 4-61264 | 2/1992 |
| JP | 6-120048 | 4/1994 |
| JP | 9-330816 | 12/1997 |
| JP | 2007-67236 | 3/2007 |

OTHER PUBLICATIONS

A. Sutono, et al.; "RF/Microwave Characterization of Multilayer Ceramic-Based MCM Technology;" *IEEE Transactions on Advanced Packaging*; vol. 22; No. 3; Aug. 1999; pp. 326-331.
G. Lihui, et al.; High Q Multilayer Sprial Inductor on Silicon Chip for 5~6 Ghz; *IEEE Electron Device Letters*; vol. 23; No. 8; Aug. 2002; pp. 470-472.

* cited by examiner

*Primary Examiner*—Tuyen T. Nguyen
(74) *Attorney, Agent, or Firm*—Kratz, Quintos & Hanson, LLP

(57) ABSTRACT

An inductor element and an integrated electronic component that facilitate achieving a higher Q value are provided. The inductor element includes a substrate, a coil unit spaced from the substrate, and a plurality of conductive columns. The coil unit includes a plurality of spiral coils each constituted of a spiral-shaped coil lead. The spiral coils are disposed such that their winding directions are the same, and that the coil lead of each spiral coil includes a portion extending between the coil lead of at least one of the other spiral coils. End portions of the spiral coils are fixed to the substrate via the conductive columns. The integrated electronic component of the invention includes such inductor element.

11 Claims, 27 Drawing Sheets

INDUCTOR ELEMENT AND INTEGRATED ELECTRONIC COMPONENT

BACKGROUND OF THE INVENTION

1. Field of the Invention

The present invention relates to an inductor element, and to an integrated electronic component including an inductor element as a part.

2. Description of the Related Art

A RF (radio frequency) system or a RF circuit employed in a mobile phone or the like generally includes an integrated passive device (hereinafter, IPD) as a high-frequency module device, for upgrading the performance and reducing the dimensions and weight. In the IPD, passive components such as an inductor, a capacitor, a resistor, and a filter required according to the design are integrated, among which the inductor rarely fails to be incorporated. The inductor generally has a relatively low Q value, for example in comparison with the capacitor, and hence incorporating the inductor in the IPD often degrades the Q value thereof as a whole. Accordingly, various studies are being pursued for achieving a higher Q value of the IPD that includes the inductor. The techniques related to the IPD can be found, for example, in JP-A-H04-61264 and U.S. Pat. No. 5,370,766, as well as in the non-patent documents 1 and 2 cited here below.

Patent document 1: JP-A-H04-61264

Patent document 2: U.S. Pat. No. 5,370,766

Non-patent document 1: Albert Sutono et al., "IEEE TRANSACTION ON ADVANCED PACKAGING", VOL. 22, NO. 3, AUGUST 1999, p. 326-331

Non-patent document 2: Guo Lihui et al., "IEEE ELECTRON DEVICE LETTERS" VOL. 23, NO. 8, AUGUST 2002, p. 470-472

For example, the non-patent document 1 describes an IPD manufactured through a low-temperature co-fired ceramic (hereinafter, LTCC) process. In the IPD manufactured through the LTCC process, a plurality of passive components is integrally built in a multilayer ceramic substrate. To form the inductor, a plurality of spiral coils is often stacked in multiple layers in the multilayer ceramic substrate, so as to increase the inductance. The higher inductance generally leads to the higher Q value of the inductor, and hence such structure is advantageous for increasing the Q value of the overall IPD including the inductor.

The inductor thus formed incurs, however, significant parasitic capacitance, because a ceramic material (dielectric material) is interposed between mutually adjacent portions of the coil lead of the spiral coil constituting the inductor, in the IPD manufactured through the LTCC process (spiral coil bears a capacitor electrode pair-like structure formed of the mutually adjacent portions of the coil lead). Besides, in the case where the inductor is constituted of a plurality of spiral coils stacked in multiple layers (multilayer inductor) in the multilayer ceramic substrate in the IPD manufactured through the LTCC process, the inductor incurs significant parasitic capacitance because of the presence of the ceramic material (dielectric material) between the mutually adjacent portions of the coil lead. Naturally, the large parasitic capacitance of the inductor is disadvantageous for increasing the Q value thereof.

In the IPD manufactured through the LTCC process, the inductor, which is a primary constituent thereof, thus incurs significant parasitic capacitance, thereby often inhibiting the increase in Q value of the inductor, and hence in Q value of the IPD as a whole.

SUMMARY OF THE INVENTION

The present invention has been proposed in view of the foregoing situation, with an object to provide an inductor element and an integrated electronic component that facilitate achieving a higher Q value.

A first aspect of the present invention provides an inductor element. The inductor element includes a substrate, a coil unit spaced from the substrate, and a plurality of conductive columns. The coil unit includes a plurality of spiral coils, each including a spiral-shaped coil lead. The plurality of spiral coils is disposed such that the winding direction thereof becomes the same, and that the coil lead of each spiral coil includes a portion extending between the coil lead of at least one of the other spiral coils, and along the same. The end portions of each spiral coil, i.e. of each coil lead are respectively fixed to the substrate via the conductive column. The plurality of spiral coils included in the coil unit constitutes at least one inductor. At least an outermost layer of the substrate is constituted of a dielectric material.

In the inductor element thus configured, the dielectric material is not present between the mutually adjacent coil leads of the plurality of spiral coils. Moreover, the spiral coils are spaced from the substrate including the dielectric material at least on the outermost layer thereof, and hence the coil leads in the spiral coils are spaced from the dielectric material. The proposed inductor element can, therefore, suppress emergence of parasitic capacitance. Suppressing the parasitic capacitance in the inductor element contributes to increasing the Q value of the inductor element.

In the case where the spiral coil constituting the inductor is patterned on the surface of the substrate, the mutually adjacent portions of the coil lead of the spiral coil are in contact with and surrounded by the outermost layer of the substrate, which is constituted of the dielectric material. The spiral coil (inductor) including a capacitor electrode pair-like structure formed of the mutually adjacent portions of the coil lead often incurs significant parasitic capacitance, because of the presence of the substrate outermost layer (dielectric material) in the vicinity of the coil leads. In contrast, in the inductor element according to the first aspect of the present invention, since the plurality of spiral coils are spaced from the substrate, in other words since the mutually adjacent coil leads of the spiral coils are spaced from the dielectric material, the parasitic capacitance is suppressed.

In the proposed inductor element, as stated above, the plurality of spiral coils is disposed such that the winding direction thereof becomes the same, and that the coil lead of each spiral coil includes a portion extending between the coil lead of at least one of the other spiral coils, and along the same. The plurality of spiral coils thus disposed constitutes at least one inductor, and the end portions of each spiral coil are respectively fixed to the substrate via the conductive column. Such configuration facilitates securing high strength of the spiral coils, which are spaced from the substrate.

Whereas a higher strength can generally be secured by reducing the distance between a pair of columns fixing the spiral coil to the substrate, the coil unit according to the present invention practically forms a single spiral coil having an overall length of L and a multitude of turns from two spiral coils having an overall length of L/2, or three spiral coils having an overall length of L/3. Thus, the proposed inductor element allows forming a relatively long spiral coil, hence an inductor, by combining a plurality of relatively short spiral coils which is advantageous for securing required strength. The proposed inductor element, which facilitates securing higher strength of the spiral coils, permits increasing the diameter, as well as the number of turns of the spiral coils. The increase in diameter and number of turns of the spiral coils contributes to increasing the Q value.

As is apparent from the foregoing, the inductor element according to the first aspect of the present invention facilitates achieving a higher Q value.

The proposed inductor element also facilitates reducing the dimensions. In this inductor element, the footprints of the respective spiral coils of the coil unit largely overlap on the substrate. When the plurality of spiral coils included in the coil unit constitutes two or more inductors, the region on the substrate for the coil unit to be located includes a plurality of such inductors. Thus, the proposed inductor element allows efficiently locating a plurality of inductors on a substantially identical position on the substrate, which contributes to reducing the dimensions of the element.

Preferably, at least two spiral coils selected from the plurality of spiral coils may be electrically connected such that a current runs in the same direction. Here, the same direction means that the current running on the respective coil leads is revolving in the same direction, either clockwise or counterclockwise.

A second aspect of the present invention provides an inductor element. The inductor element includes a substrate, a first coil unit spaced from the substrate, a second coil unit disposed between the substrate and the first coil unit and spaced from the first coil unit, and a plurality of conductive columns. The first coil unit includes a plurality of first spiral coils, each including a spiral-shaped coil lead. The plurality of first spiral coils is disposed such that the winding direction thereof becomes the same, and that the coil lead of each first spiral coil includes a portion extending between the coil lead of at least one of the other first spiral coils, and along the same. The end portions of each first spiral coil are respectively fixed to the substrate via the conductive column. The second coil unit includes a plurality of second spiral coils, each including a spiral-shaped coil lead. The plurality of second spiral coils is disposed such that the winding direction thereof becomes the same, and that the coil lead of each second spiral coil includes a portion extending between the coil lead of at least one of the other second spiral coils, and along the same. The winding direction of the second spiral coil is opposite to that of the first spiral coil. At least one of the first spiral coils and at least one of the second spiral coils are electrically connected such that a current runs in the same direction. At least one of the first spiral coils and at least one of the second spiral coils constitute a so-called multilayer inductor.

The first coil unit of the inductor element according to the second aspect corresponds to the coil unit of the inductor element according to the first aspect. Therefore, the second aspect also provides the same technical advantages as those described referring to the first aspect.

In addition, in the inductor element according to the second aspect, the dielectric material is not present between the first spiral coil of the first coil unit and the second spiral coil of the second coil unit, which is advantageous for suppressing the parasitic capacitance. Suppressing the parasitic capacitance in the inductor element contributes to increasing the Q value thereof.

In an exemplary embodiment of the second aspect of the present invention, the second coil unit is located in contact with the substrate.

In another exemplary embodiment of the second aspect of the present invention, the second coil unit is spaced from the substrate, and the end portions of the second spiral coils of the second coil unit are respectively fixed to the substrate via the conductive columns.

Preferably, the first spiral coil and the second spiral coil may all be serially connected, so that a current runs in a same direction. Such configuration is desirable for increasing the inductance of the inductor constituted of the spiral coils of the first and the second coil unit.

Preferably, the number of turns of the spiral coil is N+n (N is an integer, and n is 0.3 to 0.5). This is desirable from the viewpoint of securing the balance of the spiral coil.

It is preferable that the inductor element according to the first and the second aspect of the present invention further includes an auxiliary column that fixes the coil unit to the substrate. This is desirable from the viewpoint of securing the strength of the spiral coil.

A third aspect of the present invention provides an integrated electronic component which includes the inductor element according to the first or second aspect of the present invention. Such integrated electronic component facilitates achieving a higher Q value.

In the case where the integrated electronic component according to the third aspect of the present invention includes the inductor element according to the second aspect, at least one of the first spiral coils and at least one of the second spiral coils are electrically connected via a capacitor element.

DETAILED DESCRIPTION OF THE PREFERRED EMBODIMENTS

Figure 1:
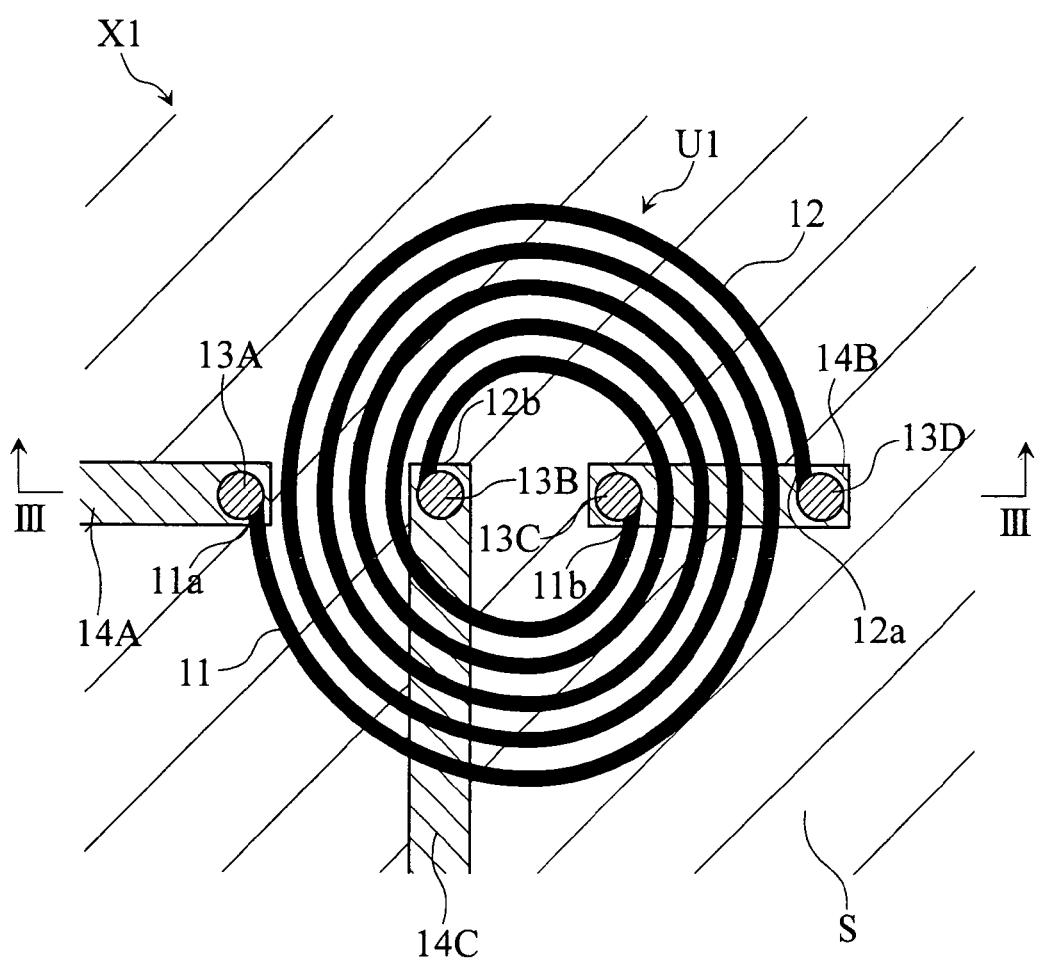
FIG. 1 is a plan view showing an inductor element according to a first embodiment of the present invention.
Figure 2:
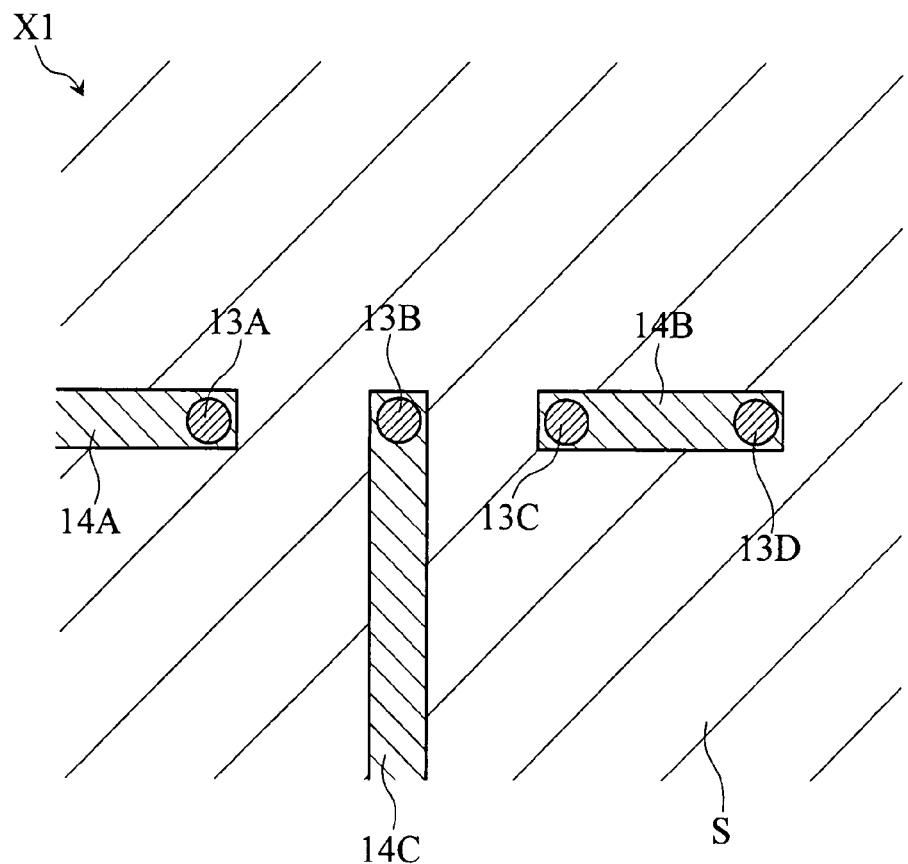
FIG. 2 is a fragmentary plan view of the inductor element shown in FIG. 1.
Figure 3:
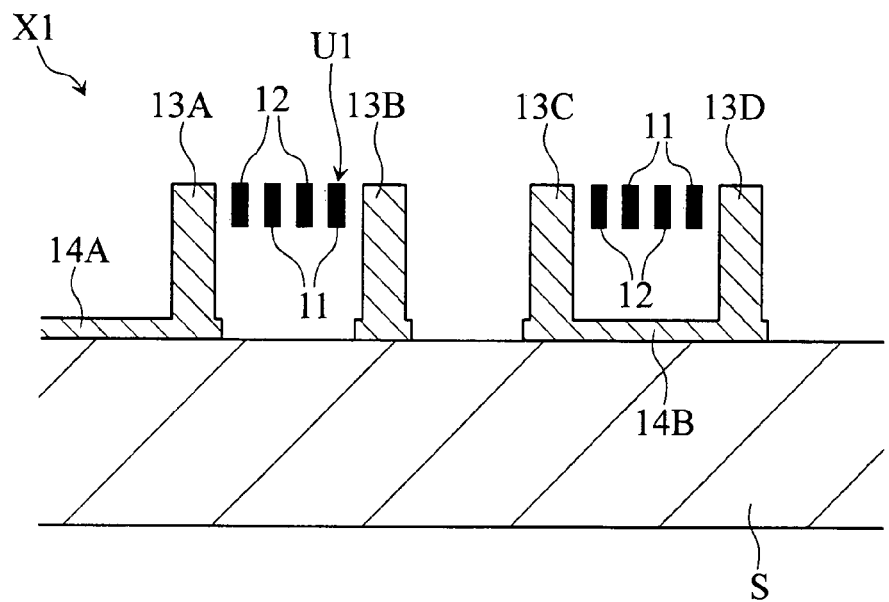
FIG. 3 is a cross-sectional view taken along a line III-III in FIG. 1.

FIGS. 1 to 3 illustrate an inductor element X1 according to a first embodiment of the present invention. FIG. 1 is a plan view of the inductor element X1. FIG. 2 is a fragmentary plan view of the inductor element X1. FIG. 3 is a cross-sectional view taken along a line III-III in FIG. 1.

The inductor element X1 includes a substrate S, a coil unit U1 (not shown in FIG. 2), conductive columns 13A, 13B, 13C, 13D, and interconnects 14A, 14B, 14C.

The substrate S may be a semiconductor substrate (for example constituted of a silicon material, such as monocrystalline silicon), a quartz substrate, a glass substrate, a ceramic substrate, a silicon-on-insulator (SOI) substrate, a silicon-on-quartz (SOQ) substrate, or a silicon-on-glass (SOG) substrate, and a surface thereof is coated with a dielectric material, as may be required. At least the outermost layer of the substrate S includes the dielectric material.

The coil unit U1 includes two spiral coils 11, 12 located with a spacing from the substrate S. As shown in FIG. 1, the spiral coil 11 includes a spiral-shaped coil lead, with an outer end portion 11a and an inner end portion 11b. The spiral coil 12 includes a spiral-shaped coil lead, with an outer end portion 12a and an inner end portion 12b. The spiral coils 11, 12 are disposed such that the winding direction of the spiral coils 11, 12 becomes the same, and that the coil lead of one of the spiral coils includes a portion extending between the coil lead of the other spiral coil. The spacing between the spiral coils 11, 12 and the substrate S is, for example, 1 to 100 μm. The spiral coils 11, 12 are constituted of, for example, Cu, Au, Ag, or Al.

The outer end portions 11a, 12a and the inner end portions 11b, 12b of the spiral coils 11, 12 are respectively fixed to the substrate S via the conductive columns 13A to 13D. The conductive columns 13A to 13D are constituted of, for example, Cu, Au, Ag, or Al.

The outer end portion 11a of the spiral coil 11 is electrically connected to an electrode pad (not included in the drawings) via the conductive column 13A and the interconnect 14A. The inner end portion 11b of the spiral coil 11 is electrically connected to the outer end portion 12a of the spiral coil 12, via the conductive column 13C, the interconnect 14B, and the conductive column 13D. The inner end portion 12b of the spiral coil 12 is electrically connected to another electrode pad (not included in the drawings) via the conductive column 13B and the interconnect 14C.

In the inductor element X1 thus configured, the spiral coils 11, 12 each having 2.5 turns are serially connected, and hence the coil unit U1 constitutes a coil inductor having 5 turns in total. In the spiral coils 11, 12, a current runs in the same direction when power is supplied.

In the inductor element X1, the dielectric material is not present between the coil leads of the coil unit U1 (spiral coils 11, 12). Moreover, the spiral coils 11, 12 are spaced from the substrate S including the dielectric material at least on the outermost layer thereof, and hence the coil leads in the spiral coils 11, 12 are spaced from the dielectric material. The inductor element X1 can, therefore, suppress emergence of parasitic capacitance. Such inductor element X1 contributes to achieving a higher Q value.

In the inductor element X1, as stated above, the spiral coils 11, 12 included in the coil unit U1 are disposed such that the winding direction thereof becomes the same, and that the coil lead of each spiral coil includes a portion extending between the coil lead of the other spiral coil, and along the same, so that the spiral coils thus disposed constitute a single inductor, and the outer end portions 11a, 12a and the inner end portions 11b, 12b of the spiral coils 11, 12 are respectively fixed to the substrate S via the conductive columns 13A to 13D. Such configuration facilitates securing high strength of the spiral coils, which are spaced from the substrate. Whereas a higher strength can generally be secured by reducing the distance between a pair of columns fixing the spiral coil to the substrate, the coil unit U1 practically forms a single spiral coil having an overall length of L and the number of turns of N (in this embodiment, N=5), from the two spiral coils having an overall length of L/2 and the number of turns of N/2. Thus, the inductor element X1 allows forming a relatively long spiral coil, hence an inductor, by combining two relatively short spiral coils, which are advantageous for securing required strength. The inductor element X1, which facilitates securing higher strength of the spiral coils, permits increasing the diameter, as well as the number of turns of the spiral coils, thereby facilitating increasing the Q value.

Thus, the inductor element X1 facilitates achieving a higher Q value.

Figure 4:
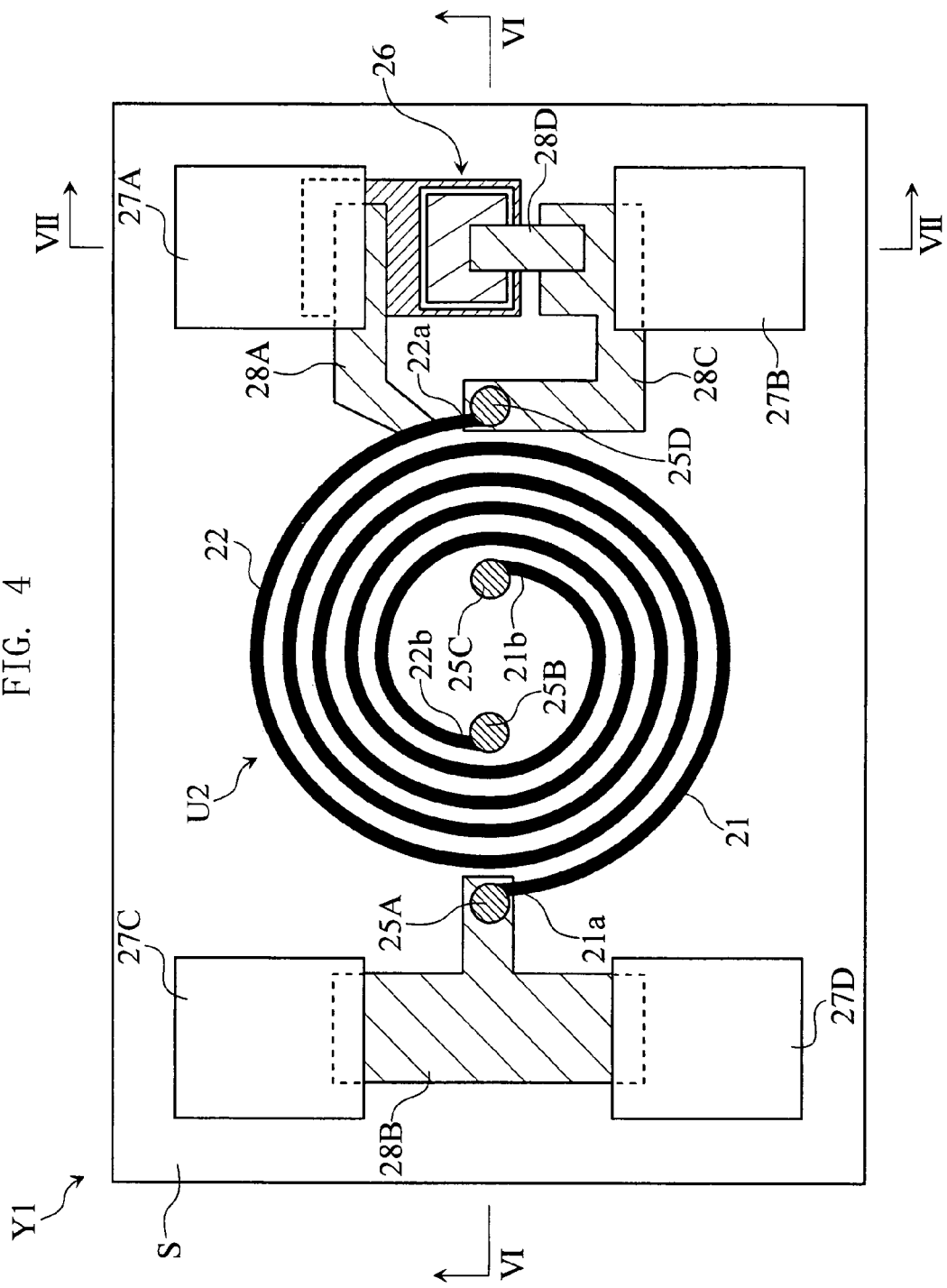
FIG. 4 is a plan view showing an integrated electronic component according to a first embodiment of the present invention.
Figure 5:
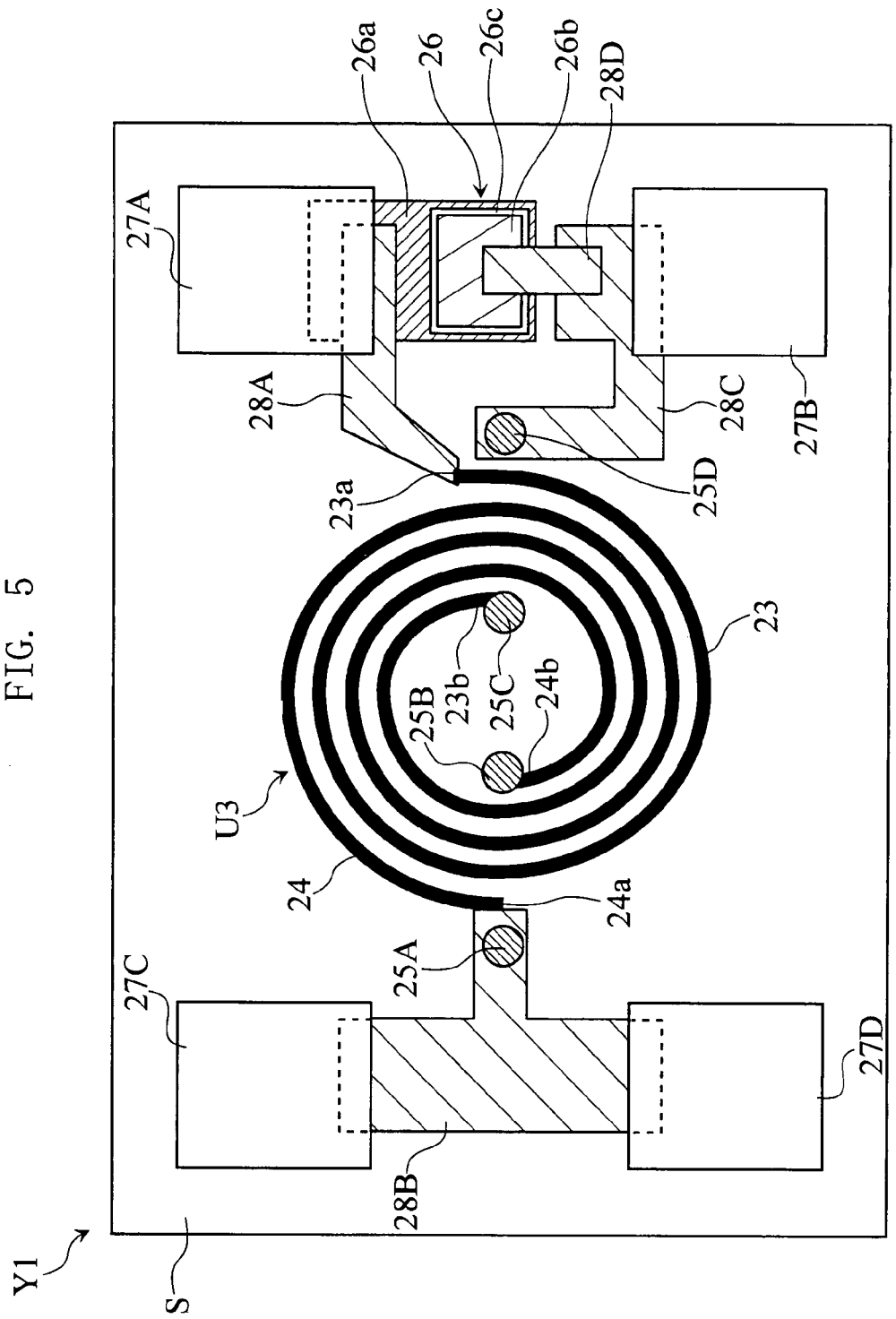
FIG. 5 is a fragmentary plan view of the integrated electronic component shown in FIG. 4.
Figure 6:
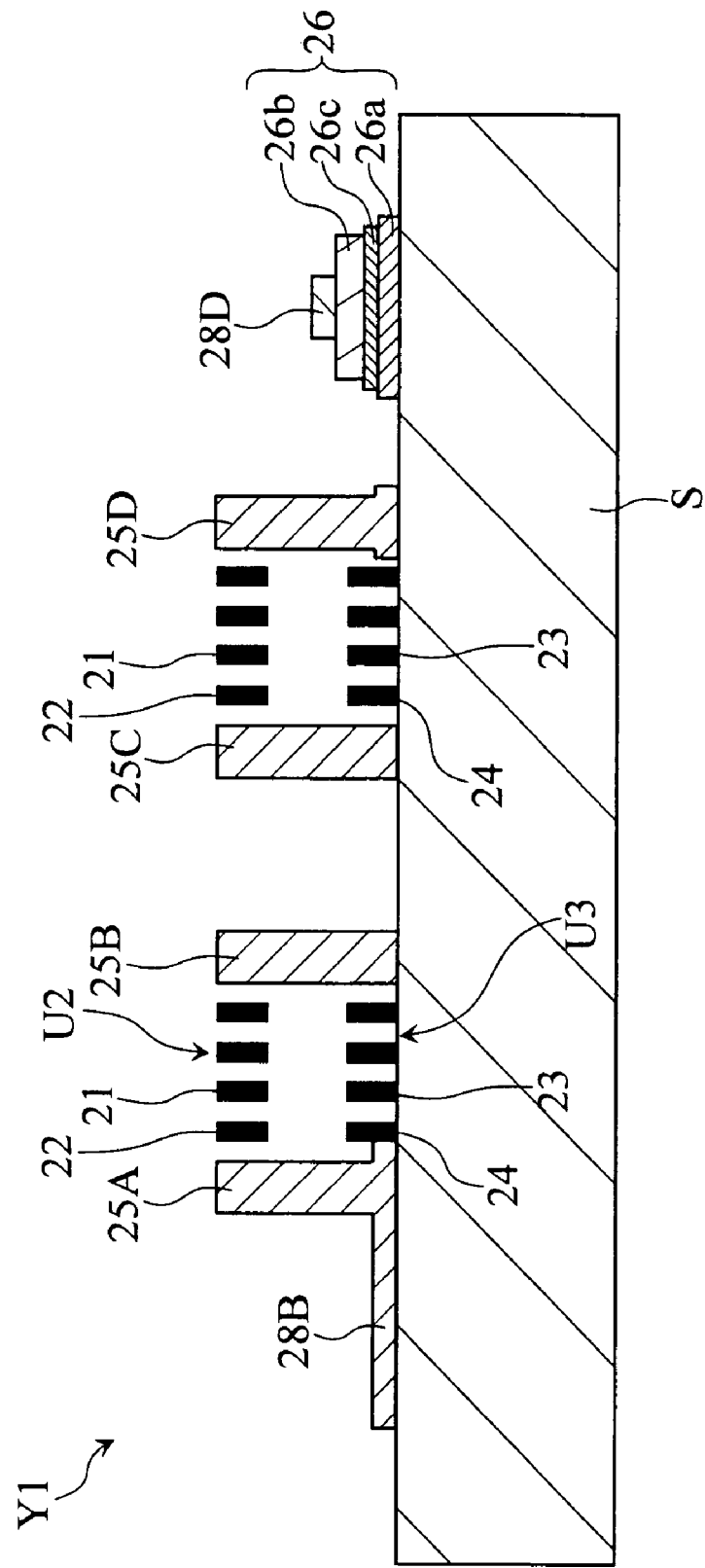
FIG. 6 is a cross-sectional view taken along a line VI-VI in FIG. 4.
Figure 7:
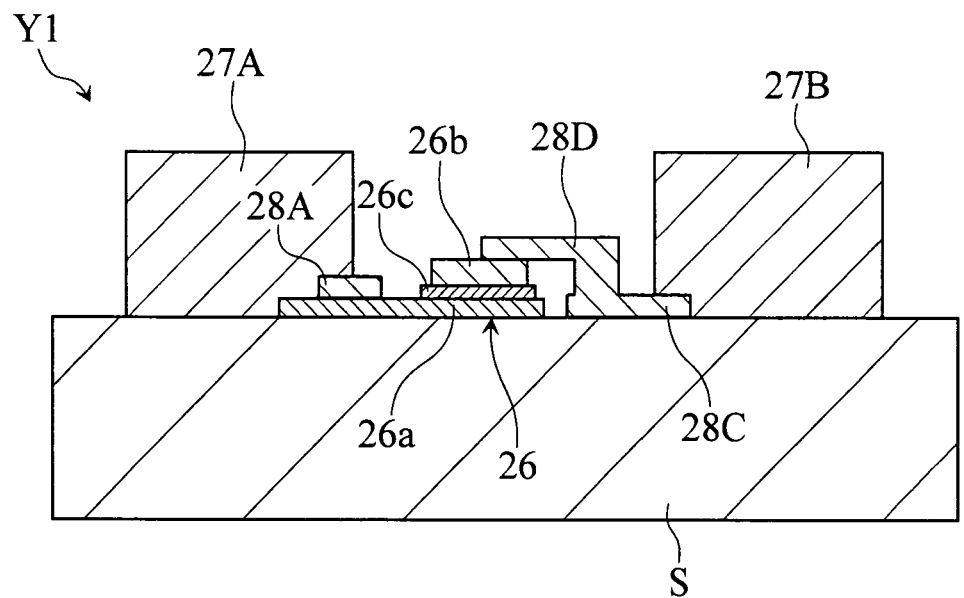
FIG. 7 is a cross-sectional view taken along a line VII-VII in FIG. 4.

FIGS. 4 to 7 illustrate an integrated electronic component Y1 according to a second embodiment of the present invention. FIG. 4 is a plan view of the integrated electronic component Y1. FIG. 5 is a fragmentary plan view of the integrated electronic component Y1. FIGS. 6 and 7 are cross-sectional views taken along a line VI-VI and VII-VII in FIG. 4, respectively.

Figure 8:
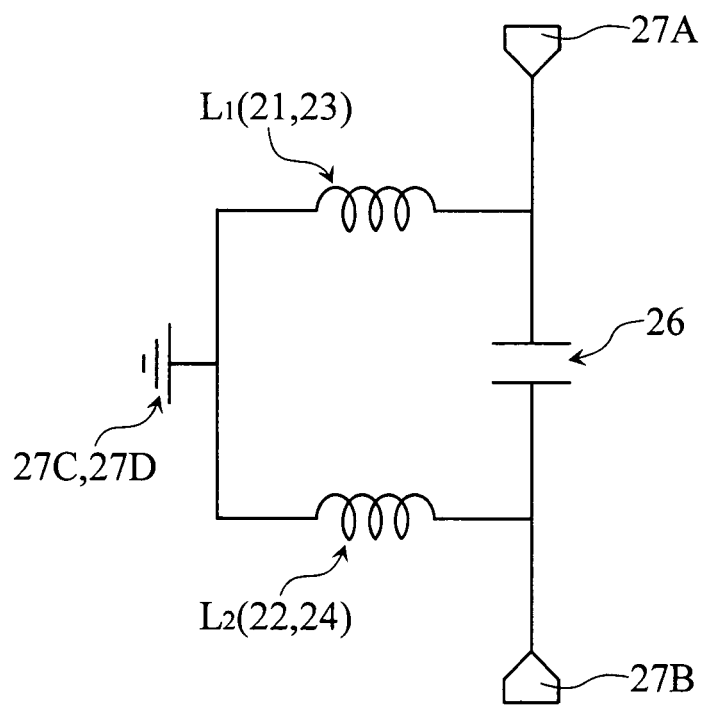
FIG. 8 is a circuit diagram of the integrated electronic component shown in FIG. 4.

The integrated electronic component Y1 includes a substrate S, a coil unit U2 (not shown in FIG. 5), a coil unit U3, conductive columns 25A, 25B, 25C, 25D, a capacitor 26, pads 27A, 27B, 27C, 27D, and interconnects 28A, 28B, 28C, 28D, and may be expressed as the circuit diagram shown in FIG. 8.

The coil unit U2 includes two spiral coils 21, 22 located with a spacing from the substrate S. As shown in FIG. 4, the spiral coil 21 includes a spiral-shaped coil lead, with an outer end portion 21a and an inner end portion 21b. The spiral coil 22 includes a spiral-shaped coil lead, with an outer end portion 22a and an inner end portion 22b. The spiral coils 21, 22 are disposed such that the winding direction of the spiral coils 21, 22 becomes the same, and that the coil lead of one of the spiral coils includes a portion extending between the coil lead of the other spiral coil, and along the same. The outer end portions 21a, 22a and the inner end portions 21b, 22b of the spiral coils 21, 22 are respectively fixed to the substrate S via the conductive columns 25A to 25D. The spiral coils 21, 22 and the conductive columns 25A to 25D are constituted of, for example, Cu, Au, Ag, or Al. The spacing between the spiral coils 21, 22 and the substrate S is, for example, 1 to 100 μm. For the sake of simplicity, FIG. 4 excludes most of the components actually provided right under the coil unit U2 on the substrate S.

As shown in FIG. 5, the coil unit U3 includes two spiral coils 23, 24 patterned on the substrate S. The spiral coil 23 includes a spiral-shaped coil lead, with an outer end portion 23a and an inner end portion 23b. The spiral coil 24 includes a spiral-shaped coil lead, with an outer end portion 24a and an inner end portion 24b. The spiral coils 23, 24 are disposed such that the winding direction of the spiral coils 23, 24 becomes the same, and that the coil lead of one of the spiral coils includes a portion extending between the coil lead of the other spiral coil, and along the same. The winding direction of the spiral coils 23, 24 of the coil unit U3 is opposite to that of the spiral coils 21, 22 of the coil unit U2. The inner end portion 23b of the spiral coil 23 is connected to the conductive column 25C. The outer end portion 24a of the spiral coil 24 is connected to the interconnect 28B, and the inner end portion 24b to the conductive column 25B. The spiral coils 23, 24 are, for example, constituted of Cu, Au, Ag, or Al.

The capacitor 26 has, as is apparent from FIGS. 6 and 7, a multilayer structure including a first electrode 26a and a second electrode 26b provided on the substrate S, and a dielectric layer 26c provided between the electrodes. The first electrode 26a may include a predetermined multilayer structure, and each of the layers includes a metal selected from Cu, Au, Ag, and Al. The second electrode 26b may be constituted of Cu, Au, Ag, or Al. The dielectric layer 26c may be constituted of silicon oxide, silicon nitride, aluminum oxide, tantalum oxide, or titanium oxide.

The pads 27A to 27D are electric pads for external connection. In this embodiment, the pad 27A is a terminal for inputting an electrical signal; the pad 27B is a terminal for outputting an electrical signal; and the pads 27C, 27D are grounded. The pads 27A to 27D are constituted of, for example, a Ni body coated with Au on its upper surface.

Figure 9:
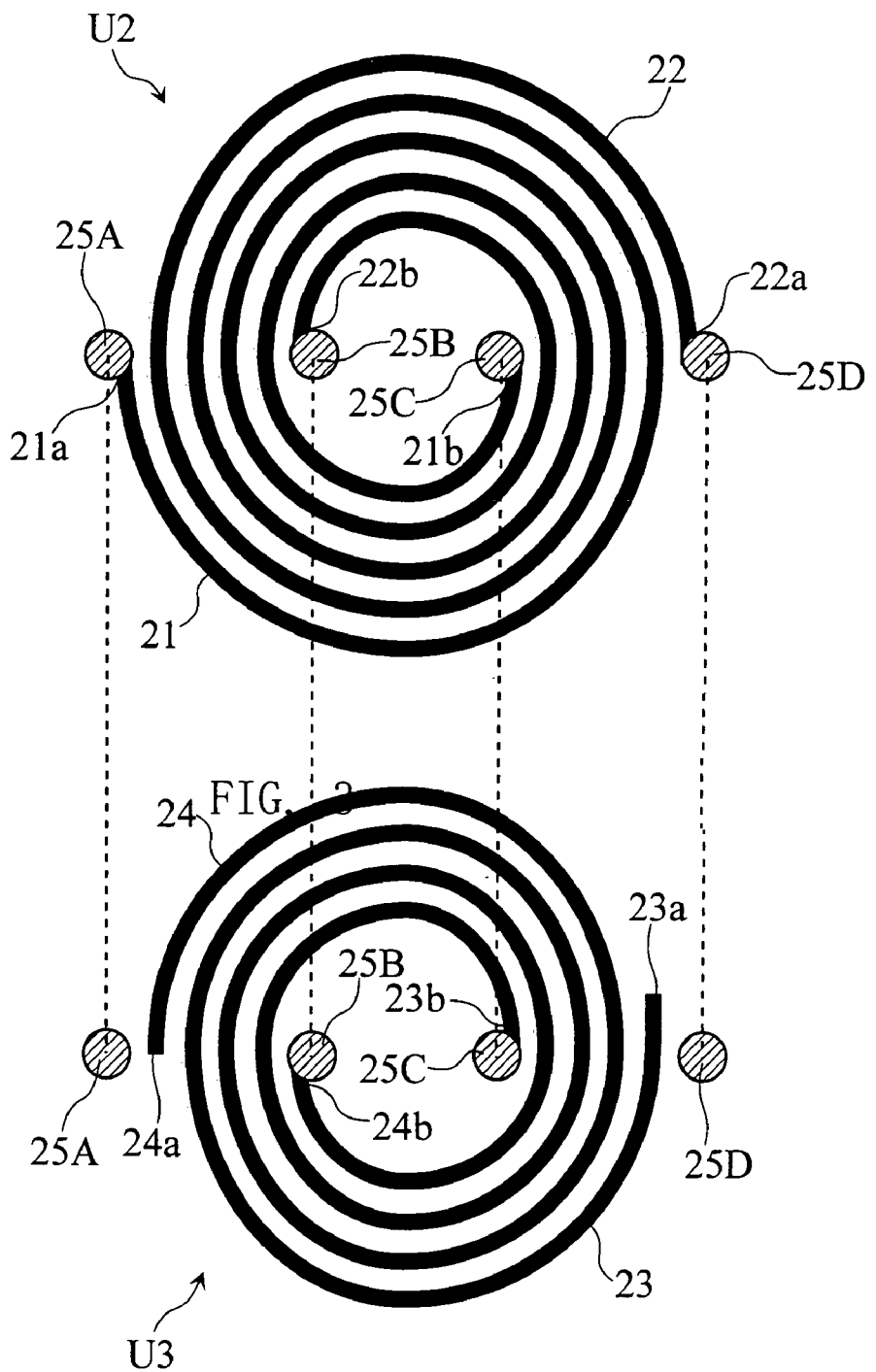
FIG. 9 is an exploded plan view of a coil unit according to the second embodiment.

As shown in FIG. 5, the pad 27A and the first electrode 26a of the capacitor 26 are electrically connected to the outer end portion 23a of the spiral coil 23 in the coil unit U3, via the interconnect 28A. As is apparent from FIG. 9, which is an exploded plan view of the coil units U2, U3, the inner end portion 23b of the spiral coil 23 is electrically connected to the inner end portion 21b of the spiral coil 21 in the coil unit U2, via the conductive column 25C. The outer end portion 21a of the spiral coil 21 is electrically connected to the outer end portion 24a of the spiral coil 24 in the coil unit U3, via the conductive column 25A and the interconnect 28B, as well as to the pads 27C, 27D via the conductive column 25A and the interconnect 28B. The inner end portion 24b of the spiral coil 24 is electrically connected to the inner end portion 22b of the spiral coil 22 in the coil unit U2, via the conductive column 25B. The outer end portion 22a of the spiral coil 22 is electrically connected to the pad 27B via the conductive column 25D and the interconnect 28C, as well as to the second electrode 26b of the capacitor 26 via the conductive column 25D and the interconnects 28C, 28D.

In the coil units U2, U3 of the integrated electronic component Y1 thus configured, the spiral coil 21 having 2.5 turns and the spiral coil 23 having 2 turns are serially connected, thereby constituting a coil inductor $L_1$ having 4.5 turns in total shown in FIG. 8. Likewise, the spiral coil 22 having 2.5 turns and the spiral coil 24 having 2 turns are serially connected, thereby constituting a coil inductor $L_2$ having 4.5 turns in total shown in FIG. 8. In the spiral coils 11, 12, a current runs in the same direction when power is supplied. The coil inductors $L_1$, $L_2$ are arranged in series as shown in FIG. 8. In the spiral coils 21 to 24 thus configured, the current runs in the same direction when the power is on.

In the integrated electronic component Y1, the dielectric material is present neither between the coil leads of the coil unit U2 (spiral coils 21, 22), nor between the coil leads of the coil unit U3 (spiral coils 23, 24). Moreover, the spiral coils 21, 22 are spaced from the substrate S including the dielectric material at least on the outermost layer thereof. In other words, the mutually adjacent coil leads in the spiral coils 21, 22 are spaced from the dielectric material. Further, the dielectric material is not present between the coil unit U2 including the spiral coils 21, 22 and the coil unit U3 including the spiral coils 23, 24. The integrated electronic component Y1 can, therefore, suppress emergence of parasitic capacitance. Such integrated electronic component Y1 contributes to achieving a higher Q value.

As already stated, in the spiral coils 21 to 24 in the integrated electronic component Y1, the current runs in the same direction when the power is on. Such arrangement is desirable for gaining mutual inductance which contributes to increasing the overall inductance, with respect to the coil inductors $L_1$, $L_2$ shown in FIG. 8.

In the integrated electronic component Y1, two coil inductors $L_1$, $L_2$ are efficiently disposed on the substantially identical location on the substrate S. Such configuration facilitates reducing the dimensions of the integrated electronic component.

Figure 10:
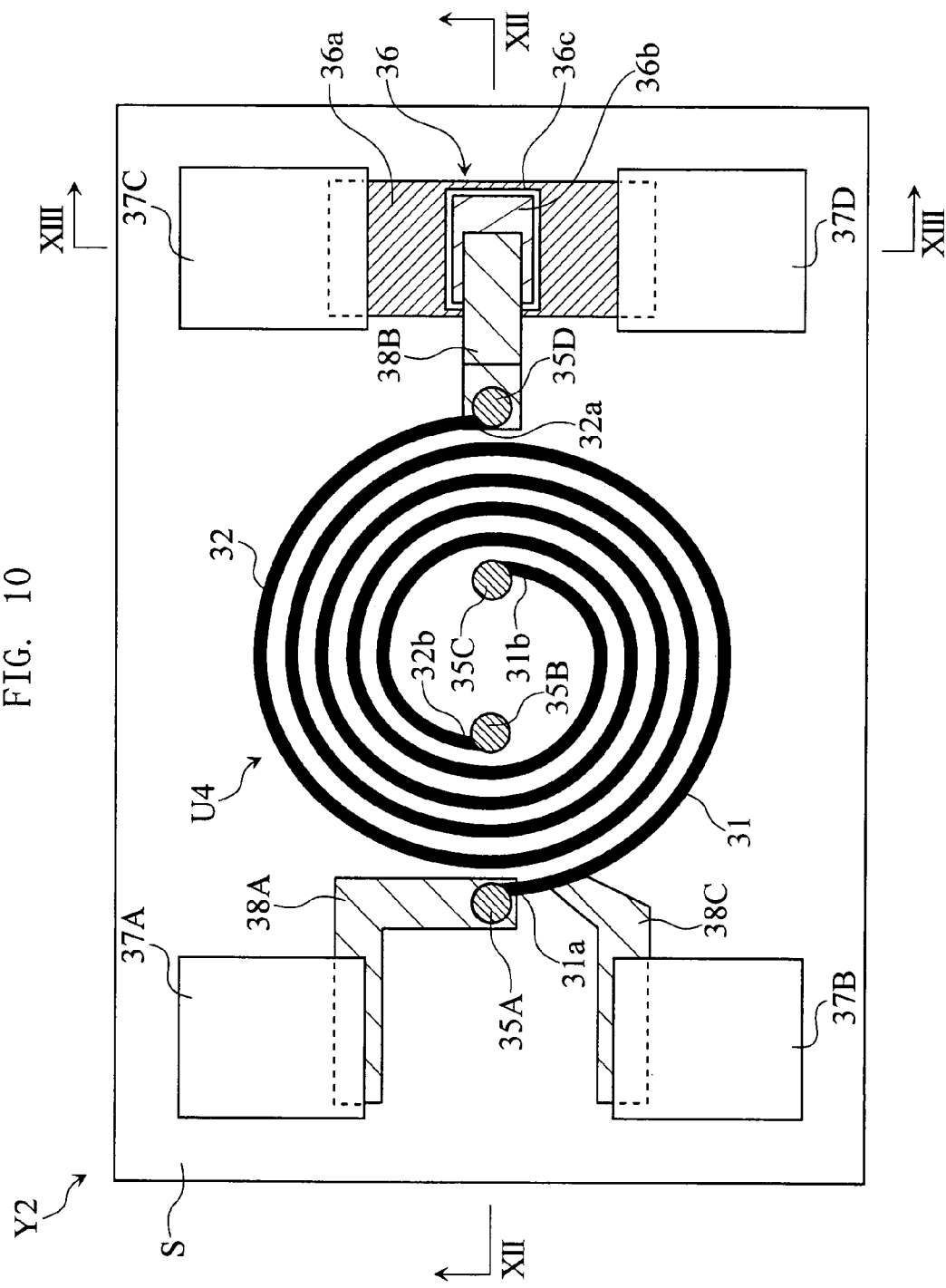
FIG. 10 is a plan view showing an integrated electronic component according to a third embodiment of the present invention.
Figure 11:
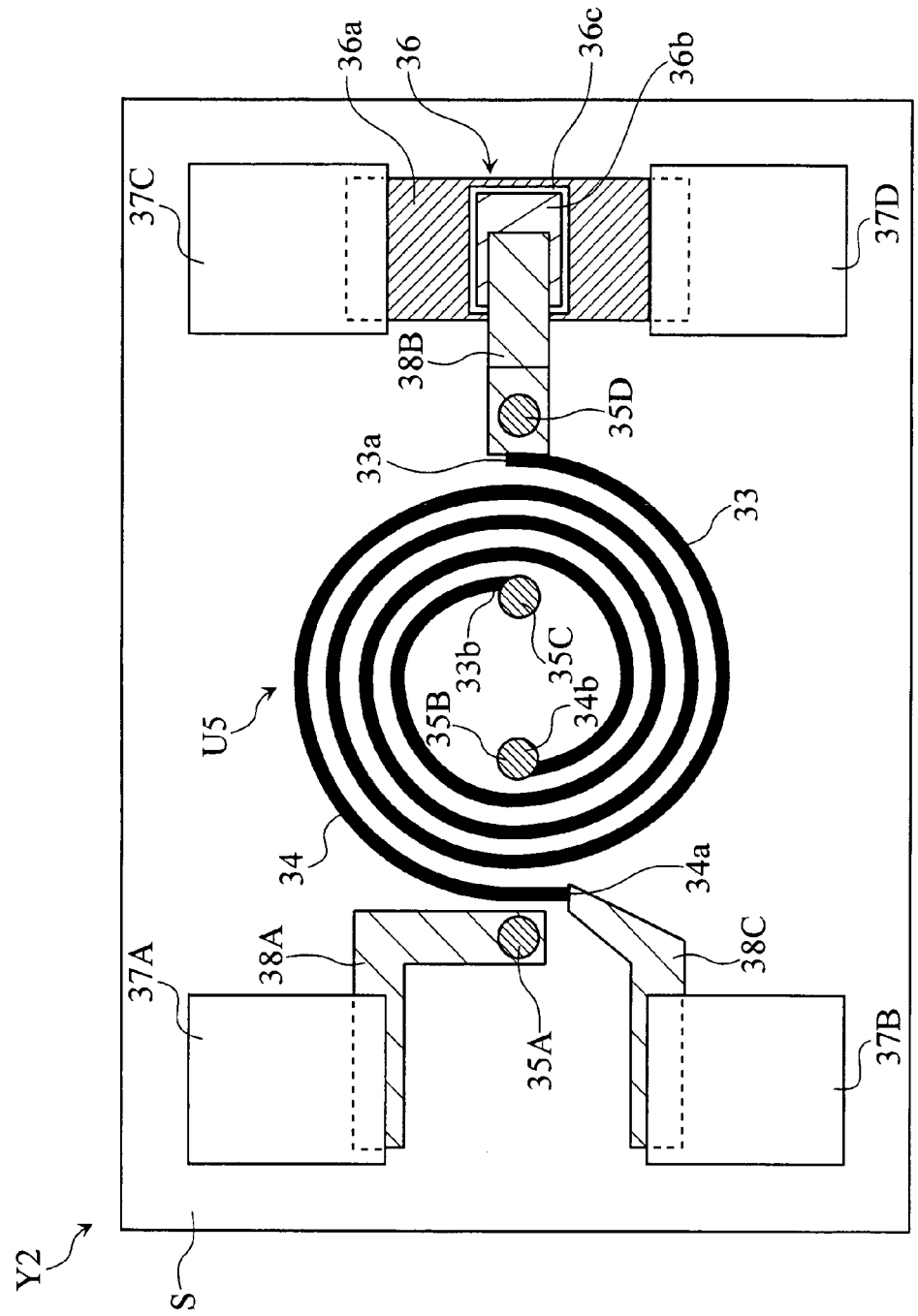
FIG. 11 is a fragmentary plan view of the integrated electronic component shown in FIG. 10.
Figure 12:
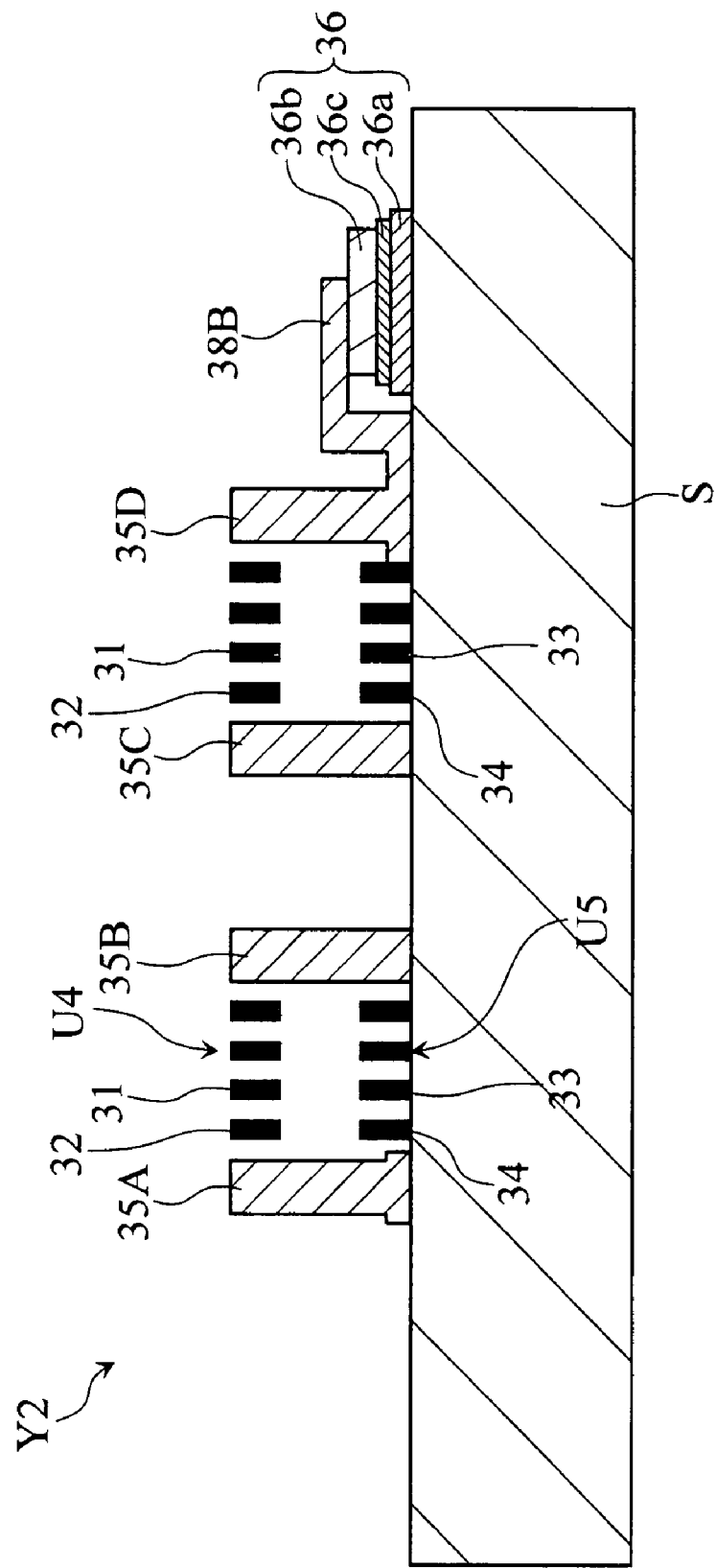
FIG. 12 is a cross-sectional view taken along a line XII-XII in FIG. 10.
Figure 13:
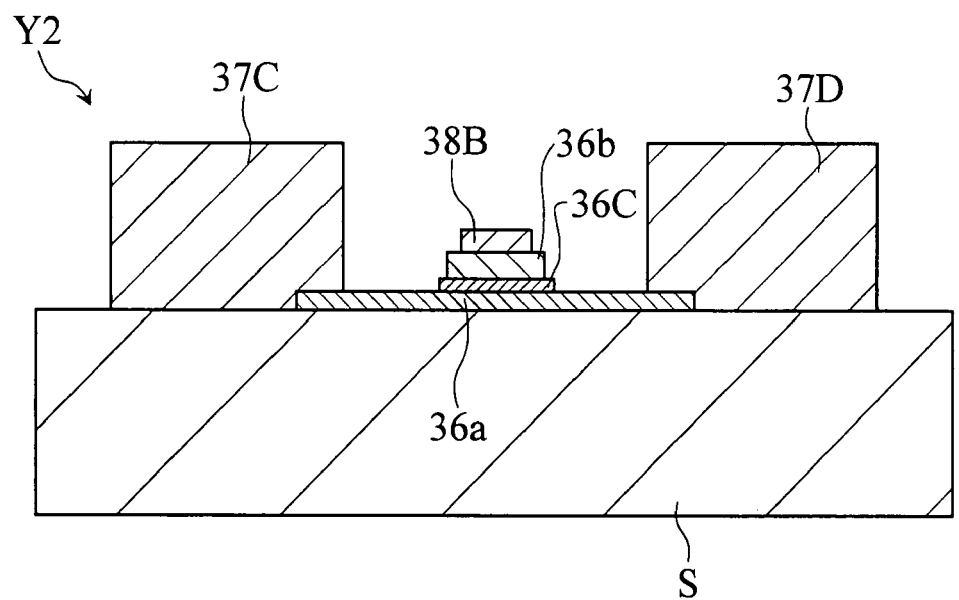
FIG. 13 is a cross-sectional view taken along a line XIII-XIII in FIG. 10.

FIGS. 10 to 13 illustrate an integrated electronic component Y2 according to a third embodiment of the present invention. FIG. 10 is a plan view of the integrated electronic component Y2. FIG. 11 is a fragmentary plan view of the integrated electronic component Y2. FIGS. 12 and 13 are cross-sectional views taken along a line XII-XII and XIII-XIII in FIG. 10, respectively.

Figure 14:
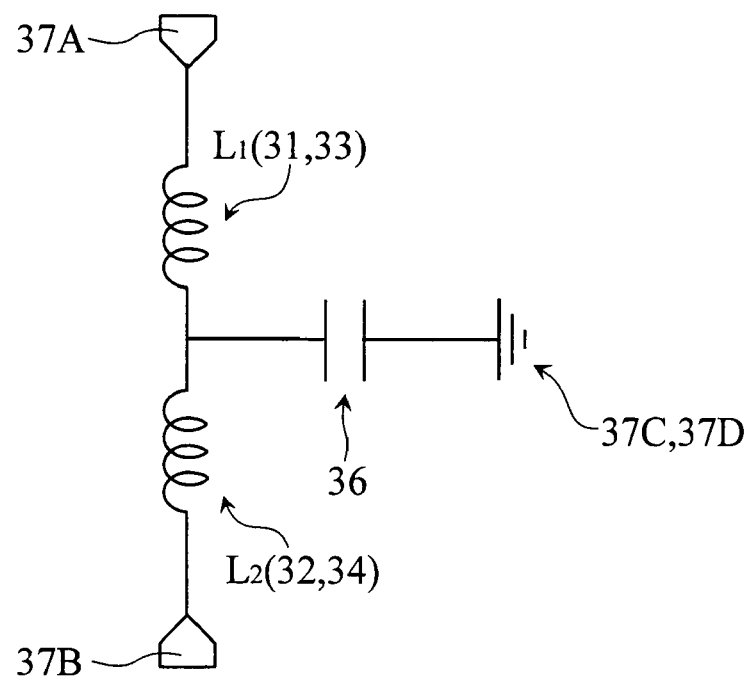
FIG. 14 is a circuit diagram of the integrated electronic component shown in FIG. 10.

The integrated electronic component Y2 includes a substrate S, a coil unit U4 (not shown in FIG. 11), a coil unit U5, conductive columns 35A, 35B, 35C, 35D, a capacitor 36, pads 37A, 37B, 37C, 37D, and interconnects 38A, 38B, 38C, and may be expressed as the circuit diagram shown in FIG. 14.

The coil unit U4 includes two spiral coils 31, 32 located with a spacing from the substrate S. As shown in FIG. 10, the spiral coil 31 includes a spiral-shaped coil lead, with an outer end portion 31a and an inner end portion 31b. The spiral coil 32 includes a spiral-shaped coil lead, with an outer end portion 32a and an inner end portion 32b. The spiral coils 31, 32 are disposed such that the winding direction of the spiral coils 31, 32 becomes the same, and that the coil lead of one of the spiral coils includes a portion extending between the coil lead of the other spiral coil, and along the same. The outer end portions 31a, 32a and the inner end portions 31b, 32b of the spiral coils 31, 32 are respectively fixed to the substrate S via the conductive columns 35A to 35D. The spiral coils 31, 32 and the conductive columns 35A to 35D are constituted of, for example, Cu, Au, Ag, or Al. The spacing between the spiral coils 31, 32 and the substrate S is, for example, 1 to 100 µm. For the sake of simplicity, FIG. 10 excludes most of the components actually provided right under the coil unit U4 on the substrate S.

As shown in FIG. 11, the coil unit U5 includes two spiral coils 33, 34 patterned on the substrate S. The spiral coil 33 includes a spiral-shaped coil lead, with an outer end portion 33a and an inner end portion 33b. The spiral coil 34 includes a spiral-shaped coil lead, with an outer end portion 34a and an inner end portion 34b. The spiral coils 33, 34 are disposed such that the winding direction of the spiral coils 33, 34 becomes the same, and that the coil lead of one of the spiral coils includes a portion extending between the coil lead of the other spiral coil, and along the same. The winding direction of the spiral coils 33, 34 of the coil unit U5 is opposite to that of the spiral coils 31, 32 of the coil unit U4. The outer end portion 33a of the spiral coil 33 is connected to the interconnect 38B, and the inner end portion 33b to the conductive column 35C. The outer end portion 34a of the spiral coil 34 is connected to the interconnect 38C, and the inner end portion 34b to the conductive column 35B. The spiral coils 33, 34 are, for example, constituted of Cu, Au, Ag, or Al.

The capacitor 36 has, as is apparent from FIGS. 12 and 13, a multilayer structure including a first electrode 36a and a second electrode 36b provided on the substrate S, and a dielectric layer 36c provided between the electrodes. The first electrode 36a, the second electrode 26b and the dielectric layer 26c may be constituted of similar materials to those cited regarding the first electrode 26a, the second electrode 26b, and the dielectric layer 26c of the foregoing embodiment.

The pads 37A to 37D are electric pads for external connection. In this embodiment, the pad 37A is a terminal for inputting an electrical signal; the pad 37B is a terminal for outputting an electrical signal; and the pads 37C, 37D are grounded. The pads 37A to 37D are constituted of, for example, a Ni body coated with Au on its upper surface.

As shown in FIG. 10, the pad 37A is electrically connected to the outer end portion 31a of the spiral coil 31 in the coil unit U4, via the interconnect 38A and the conductive column 35A. The inner end portion 31b of the spiral coil 31 is electrically connected to the inner end portion 33b of the spiral coil 33 in the coil unit U5, via the conductive column 35C. The outer end portion 33a of the spiral coil 33 is electrically connected to the outer end portion 32a of the spiral coil 33 in the coil unit U4, via the conductive column 35C and the interconnect 38B, as well as to the second electrode 36b of the capacitor 36 via the interconnect 38B. The capacitor 36 is also electrically connected to the outer end portion 32a of the spiral coil 32 in the coil unit U4, via the interconnect 38B and the conductive column 35D. The inner end portion 32b of the spiral coil 32 is electrically connected to the inner end portion 34b of the spiral coil 34 in the coil unit U5, via the conductive column 35B. The outer end portion 34a of the spiral coil 34 is electrically connected to the pad 37B, via the interconnect 38C.

In the coil units U4, U5 of the integrated electronic component Y2 thus configured, the spiral coil 31 having 2.5 turns and the spiral coil 33 having 2 turns are serially connected, thereby constituting a coil inductor $L_1$ having 4.5 turns in total shown in FIG. 14. Likewise, the spiral coil 32 having 2.5 turns and the spiral coil 34 having 2 turns are serially connected, thereby constituting a coil inductor $L_2$ having 4.5 turns in total shown in FIG. 14. The coil inductors $L_1$, $L_2$ are arranged in series as shown in FIG. 14. In the spiral coils 31 to 34 thus configured, the current runs in the same direction when the power is on.

In the integrated electronic component Y2, the dielectric material is present neither between the coil leads of the coil unit U4 (spiral coils 31, 32), nor between the coil leads of the coil unit U5 (spiral coils 33, 34). Moreover, the spiral coils 31, 32 are spaced from the substrate S including the dielectric material at least on the outermost layer thereof. In other words, the mutually adjacent coil leads in the spiral coils 31, 32 are spaced from the dielectric material. Further, the dielectric material is not present between the coil unit U4 including the spiral coils 31, 32 and the coil unit U5 including the spiral coils 33, 34. The integrated electronic component Y2 can, therefore, suppress emergence of parasitic capacitance. Such integrated electronic component Y2 contributes to achieving a higher Q value.

As already stated, in the spiral coils 31 to 34 in the integrated electronic component Y2, the current runs in the same direction when the power is on. Such arrangement is desirable for gaining mutual inductance which contributes to increasing the overall inductance, with respect to the coil inductors $L_1$, $L_2$ shown in FIG. 14.

In the integrated electronic component Y2, two coil inductors $L_1$, $L_2$ are efficiently disposed on the substantially identical location on the substrate S. Such configuration facilitates reducing the dimensions of the integrated electronic component.

Figure 15:
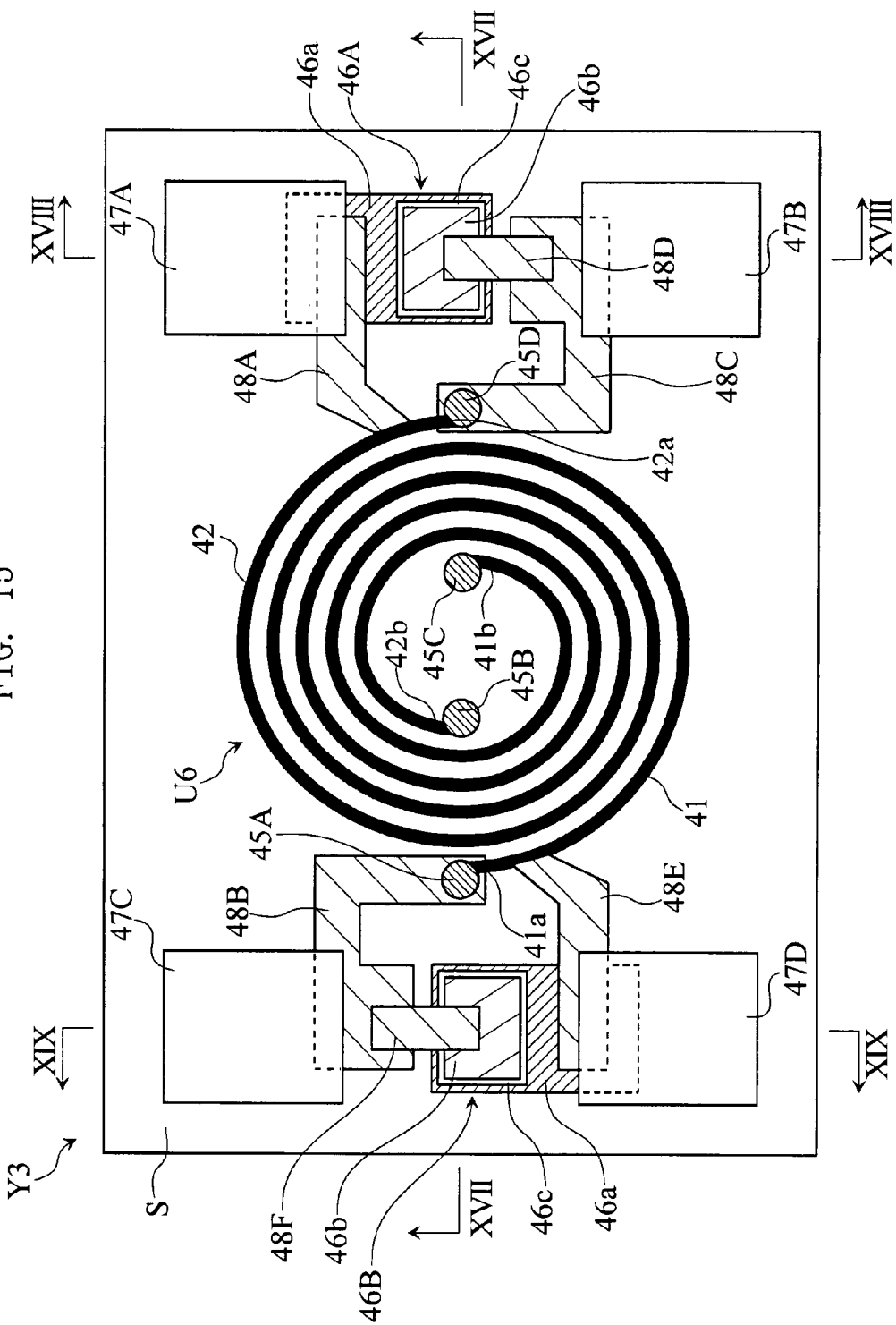
FIG. 15 is a plan view showing an integrated electronic component according to a fourth embodiment of the present invention.
Figure 16:
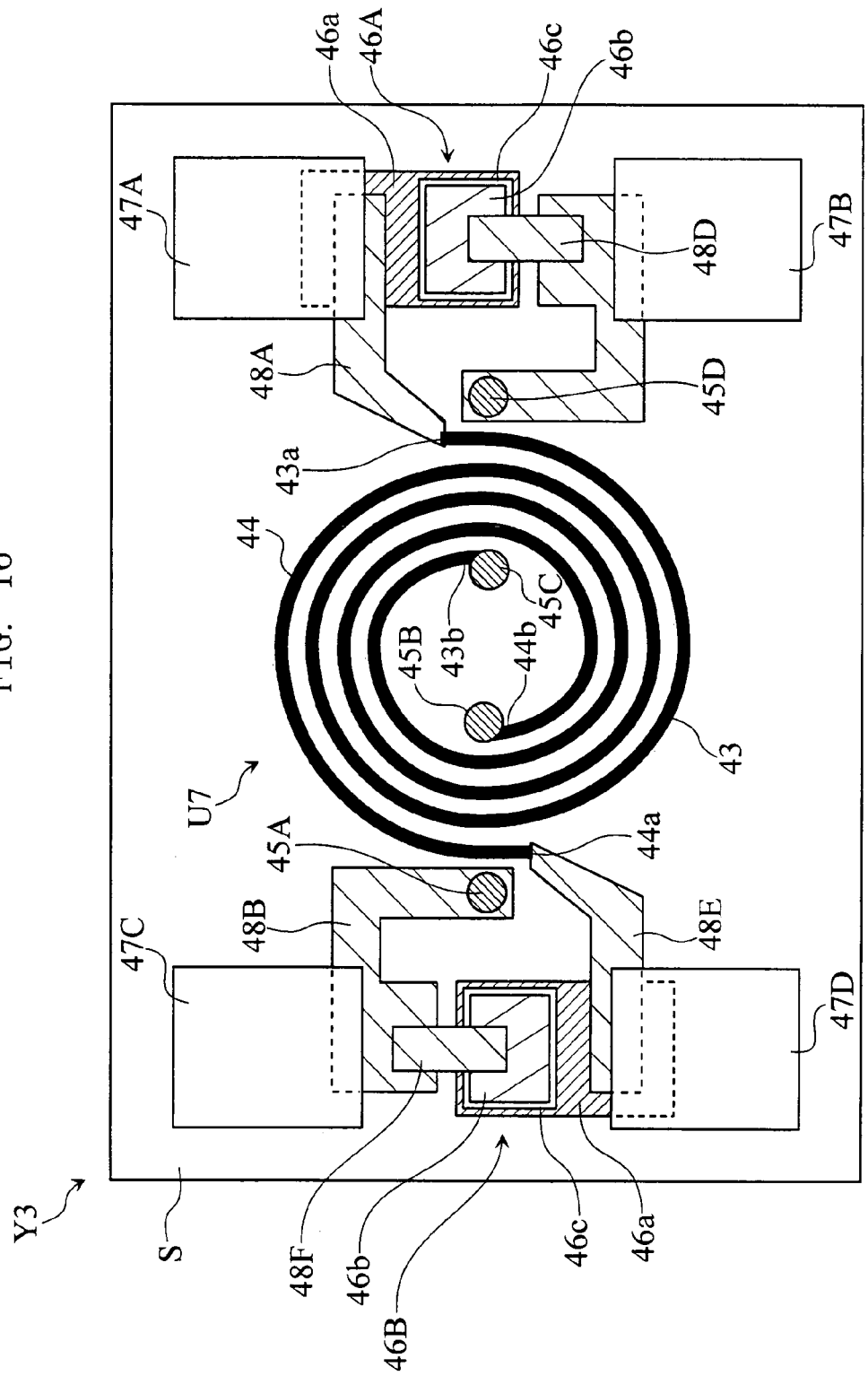
FIG. 16 is a fragmentary plan view of the integrated electronic component shown in FIG. 15.
Figure 17:
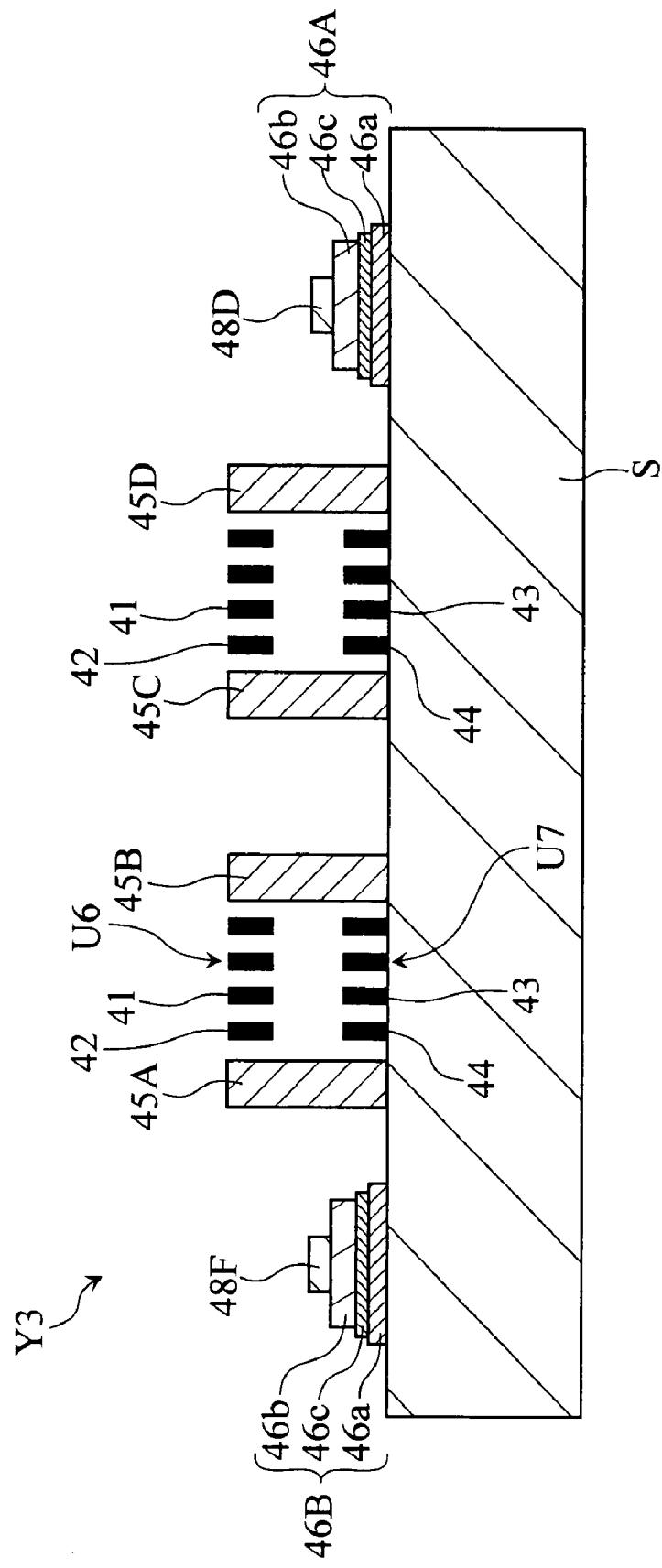
FIG. 17 is a cross-sectional view taken along a line XVII-XVII in FIG. 15.
Figure 18:
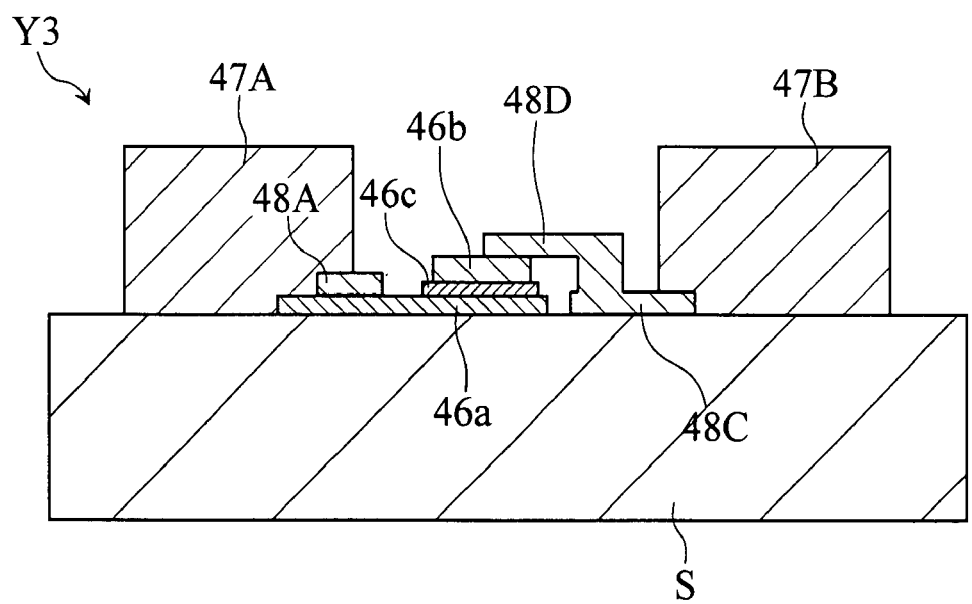
FIG. 18 is a cross-sectional view taken along a line XVIII-XVIII in FIG. 15.
Figure 19:
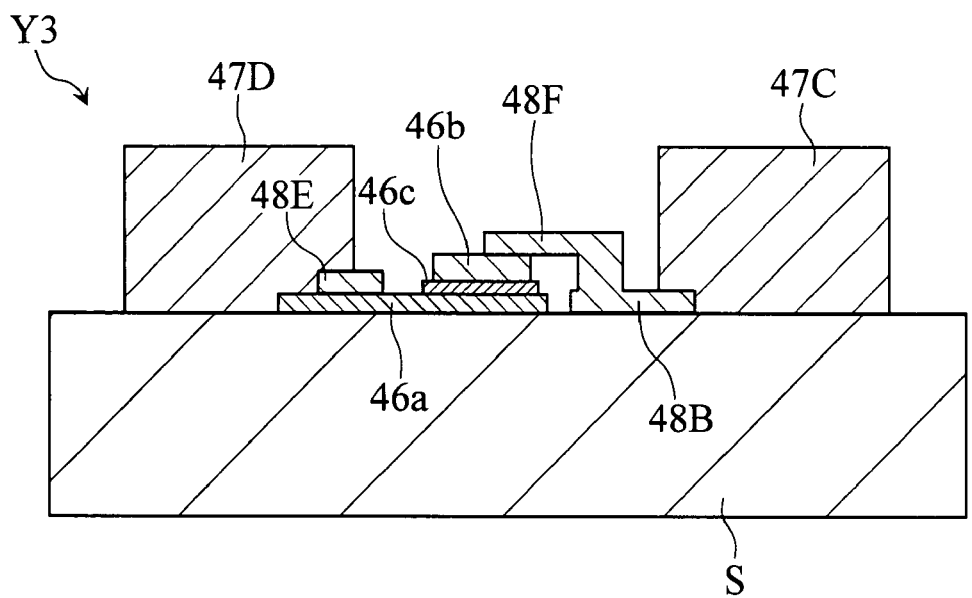
FIG. 19 is a cross-sectional view taken along a line XIX-XIX in FIG. 15.

FIGS. 15 to 19 illustrate an integrated electronic component Y3 according to a fourth embodiment of the present invention. FIG. 15 is a plan view of the integrated electronic component Y3. FIG. 11 is a fragmentary plan view of the integrated electronic component Y3. FIGS. 17 to 19 are cross-sectional views taken along a line XVII-XVII, XVIII-XVIII, and XIX-XIX in FIG. 10, respectively.

Figure 20:
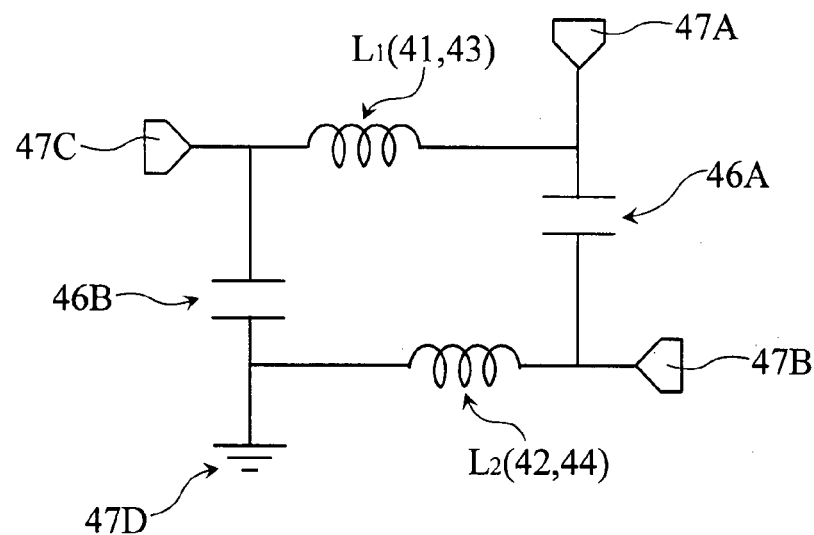
FIG. 20 is a circuit diagram of the integrated electronic component shown in FIG. 15.

The integrated electronic component Y3 includes a substrate S, a coil unit U6 (not shown in FIG. 16), a coil unit U7, conductive columns 45A, 45B, 45C, 45D, capacitors 46A, 46B, pads 47A, 47B, 47C, 47D, and interconnects 48A, 48B, 48C, 48D, 48E, 48F, and may be expressed as the circuit diagram shown in FIG. 20.

The coil unit U6 includes two spiral coils 41, 42 located with a spacing from the substrate S. As shown in FIG. 15, the spiral coil 41 includes a spiral-shaped coil lead, with an outer end portion 41a and an inner end portion 41b. The spiral coil 42 includes a spiral-shaped coil lead, with an outer end portion 42a and an inner end portion 42b. The spiral coils 41, 42 are disposed such that the winding direction of the spiral coils 41, 42 becomes the same, and that the coil lead of one of the spiral coils includes a portion extending between the coil lead of the other spiral coil. The outer end portions 41a, 42a and the inner end portions 41b, 42b of the spiral coils 41, 42 are respectively fixed to the substrate S via the conductive columns 45A to 45D. The spiral coils 41, 42 and the conductive columns 45A to 45D are constituted of, for example, Cu, Au, Ag, or Al. The spacing between the spiral coils 41, 42 and the substrate S is, for example, 1 to 100 µm. For the sake of simplicity, FIG. 15 excludes most of the components actually provided right under the coil unit U4 on the substrate S.

As shown in FIG. 16, the coil unit U7 includes two spiral coils 43, 44 patterned on the substrate S. The spiral coil 43 includes a spiral-shaped coil lead, with an outer end portion 43a and an inner end portion 43b. The spiral coil 44 includes a spiral-shaped coil lead, with an outer end portion 44a and an inner end portion 44b. The spiral coils 43, 44 are disposed such that the winding direction of the spiral coils 43, 44 becomes the same, and that the coil lead of one of the spiral coils includes a portion extending between the coil lead of the other spiral coil. The winding direction of the spiral coils 43, 44 of the coil unit U7 is opposite to that of the spiral coils 41, 42 of the coil unit U6. The inner end portion 43b of the spiral coil 43 is connected to the conductive column 45C. The inner end portion 44b of the spiral coil 44 is connected to the conductive column 45B. The spiral coils 43, 44 are, for example, constituted of Cu, Au, Ag, or Al.

The capacitors 46A, 46B respectively have, as is apparent from FIGS. 12 and 13, a multilayer structure including a first electrode 46a and a second electrode 46b provided on the substrate S, and a dielectric layer 46c provided between the electrodes. The first electrode 46a, the second electrode 46b and the dielectric layer 46c may be constituted of similar materials to those cited regarding the first electrode 26a, the second electrode 26b, and the dielectric layer 26c of the foregoing embodiment.

The pads 47A to 47D are electric pads for external connection. In this embodiment, the pad 47A is a terminal for inputting an electrical signal; the pads 47B, 47C are terminals for outputting an electrical signal; and the pad 47D is grounded. The pads 47A to 47D are constituted of, for example, a Ni body coated with Au on its upper surface.

As shown in FIG. 16, the pad 47A and the first electrode 46a of the capacitor 46 are electrically connected to the outer end portion 43a of the spiral coil 43 in the coil unit U7, via the interconnect 48A. The inner end portion 43b of the spiral coil 43 is electrically connected to the inner end portion 41b of the spiral coil 41 in the coil unit U2, via the conductive column 45C. The outer end portion 41a of the spiral coil 41 is electrically connected to the pad 47C, via the conductive column 45A and the interconnect 48B, as well as to the second electrode 46b of the capacitor 46B via the conductive column 45A and the interconnects 48B, 48F. The pad 47B is electrically connected to the second electrode 46b of the capacitor 46A via the interconnects 48C, 48D, as well as to the outer end portion 42a of the spiral coil 42 in the coil unit U6, via the interconnect 48C and the conductive column 45D. The inner end portion 42b of the spiral coil 42 is electrically connected to the inner end portion 44b of the spiral coil 44 in the coil unit U7, via the conductive column 45B. The outer end portion 44a of the spiral coil 44 is electrically connected to the pad 47D via the interconnect 48E, as well as to the first electrode 46a of the capacitor 46B via the interconnect 48E.

In the coil units U6, U7 of the integrated electronic component Y3 thus configured, the spiral coil 41 having 2.5 turns and the spiral coil 43 having 2 turns are serially connected, thereby constituting a coil inductor $L_1$ having 4.5 turns in total shown in FIG. 20. Likewise, the spiral coil 42 having 2.5 turns and the spiral coil 44 having 2 turns are serially connected, thereby constituting a coil inductor $L_2$ having 4.5 turns in total shown in FIG. 20. The coil inductors $L_1$, $L_2$ are arranged in series as shown in FIG. 20. In the spiral coils 41 to 44 thus configured, the current runs in the same direction when the power is on.

In the integrated electronic component Y3, the dielectric material is present neither between the coil leads of the coil unit U6 (spiral coils 41, 42), nor between the coil leads of the coil unit U7 (spiral coils 43, 44). Moreover, the spiral coils 41, 42 are spaced from the substrate S including the dielectric material at least on the outermost layer thereof. In other words, the mutually adjacent coil leads in the spiral coils 41, 42 are spaced from the dielectric material. Further, the dielectric material is not present between the coil unit U6 including the spiral coils 41, 42 and the coil unit U7 including the spiral coils 43, 44. The integrated electronic component Y3 can, therefore, suppress emergence of parasitic capacitance. Such integrated electronic component Y3 contributes to achieving a higher Q value.

As already stated, in the spiral coils 41 to 44 in the integrated electronic component Y3, the current runs in the same direction when the power is on. Such arrangement is desirable for gaining mutual inductance which contributes to increasing the overall inductance, with respect to the coil inductors $L_1$, $L_2$ shown in FIG. 20.

In the integrated electronic component Y3, two coil inductors $L_1$, $L_2$ are efficiently disposed on the substantially identical location on the substrate S. Such configuration facilitates reducing the dimensions of the integrated electronic component.

Figure 21:
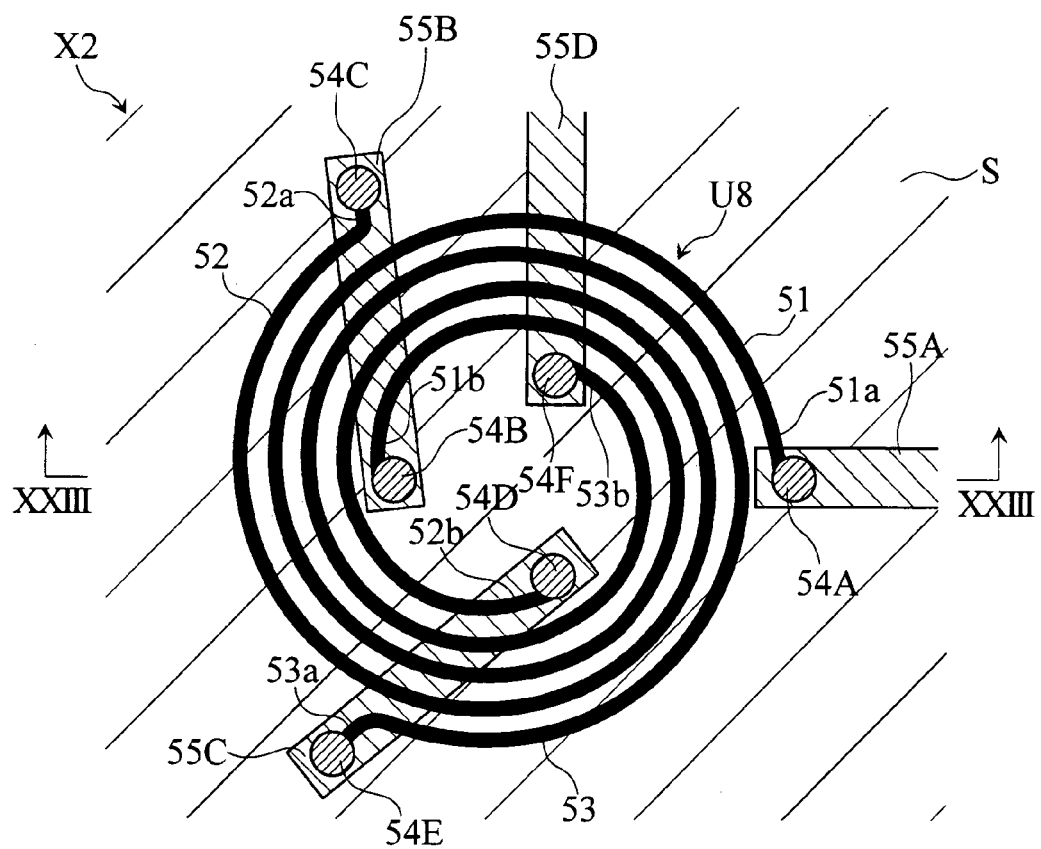
FIG. 21 is a plan view showing an inductor element according to a fifth embodiment of the present invention.
Figure 22:
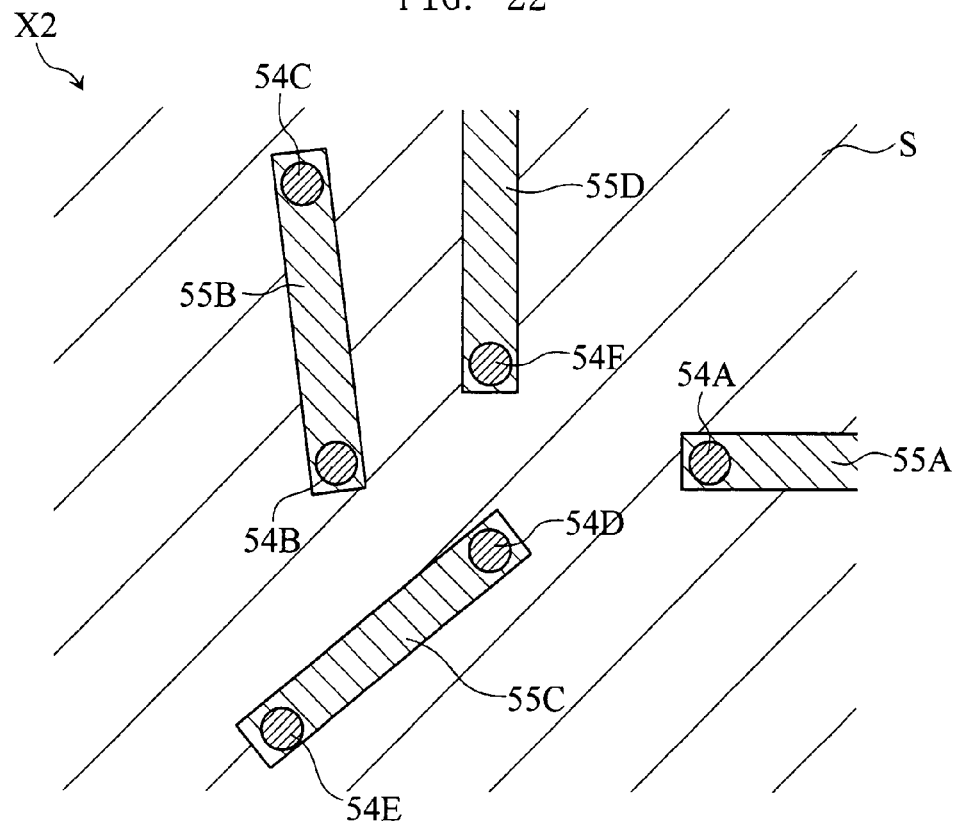
FIG. 22 is a fragmentary plan view of the inductor element shown in FIG. 21.
Figure 23:
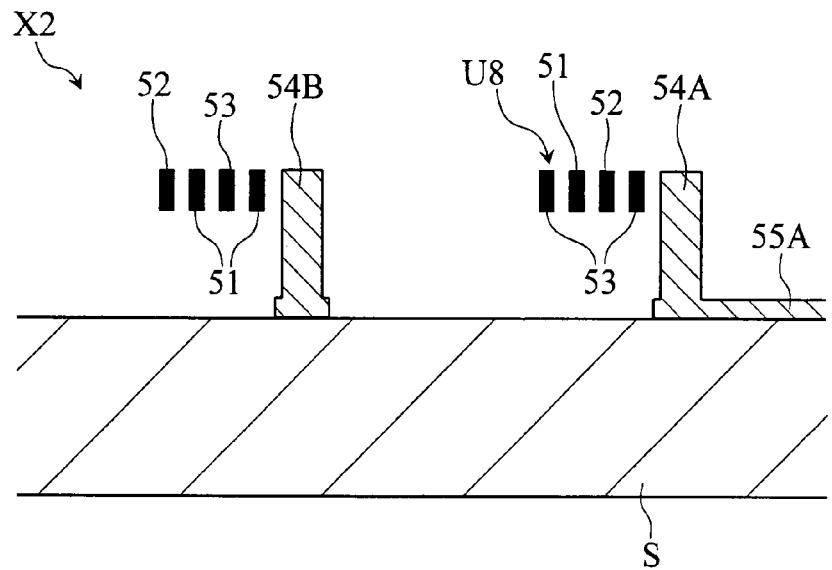
FIG. 23 is a cross-sectional view taken along a line XXIII-XXIII in FIG. 21.

FIGS. 21 to 23 illustrate an inductor element X2 according to a fifth embodiment of the present invention. FIG. 21 is a plan view of the inductor element X2. FIG. 22 is a fragmentary plan view of the inductor element X2. FIG. 23 is a cross-sectional view taken along a line XXIII-XXIII in FIG. 21.

The inductor element X2 includes a substrate S, a coil unit U8 (not shown in FIG. 22), conductive columns 54A, 54B, 54C, 54D, 54E, 54F, and interconnects 55A, 55B, 55C, 55D.

The coil unit U8 includes three spiral coils 51, 52, 53 located with a spacing from the substrate S. The spiral coil 51 includes a spiral-shaped coil lead, with an outer end portion 51a and an inner end portion 51b. The spiral coil 52 includes a spiral-shaped coil lead, with an outer end portion 52a and an inner end portion 52b. The spiral coil 53 includes a spiral-shaped coil lead, with an outer end portion 53a and an inner end portion 53b. The spiral coils 51 to 53 are disposed such that the winding direction of the spiral coils 51 to 53 becomes the same, and that the coil lead of each spiral coil includes a portion extending between the coil leads of the other spiral coils. The spacing between the spiral coils 51 to 53 and the substrate S is, for example, 1 to 100 μm. The spiral coils 51 to 53 are constituted of, for example, Cu, Au, Ag, or Al.

The outer end portions 51a, 52a, 53a and the inner end portions 51b, 52b, 53b of the spiral coils 51 to 53 are respectively fixed to the substrate S via the conductive columns 54A to 54F. The conductive columns 54A to 54F are constituted of, for example, Cu, Au, Ag, or Al.

The outer end portion 51a of the spiral coil 51 is electrically connected to an electrode pad (not included in the drawings) via the conductive column 54A and the interconnect 55A. The inner end portion 51b of the spiral coil 51 is electrically connected to the outer end portion 52a of the spiral coil 52, via the conductive column 54B, the interconnect 55B, and the conductive column 54C. The inner end portion 52b of the spiral coil 52 is electrically connected to the outer end portion 53a of the spiral coil 53, via the conductive column 54D, the interconnect 55C, and the conductive column 54E. The inner end portion 53b of the spiral coil 53 is electrically connected to another electrode pad (not included in the drawings) via the conductive column 54F and the interconnect 55D.

In the inductor element X2 thus configured, the spiral coils 51 to 53 each having 1.5 turns are serially connected, and hence the coil unit U8 constitutes a coil inductor having 4.5 turns in total. In the spiral coils 51 to 53, the current runs in the same direction when power is supplied.

In the inductor element X2, the dielectric material is not present between the coil leads of the coil unit U8 (spiral coils 51 to 53). Moreover, the spiral coils 51 to 53 are spaced from the substrate S including the dielectric material at least on the outermost layer thereof, and hence the mutually adjacent coil leads in the spiral coils 51 to 53 are spaced from the dielectric material. The inductor element X2 can, therefore, suppress emergence of parasitic capacitance. Such inductor element X2 contributes to achieving a higher Q value.

In the inductor element X2, as stated above, the spiral coils 51 to 53 included in the coil unit U8 are disposed such that the winding direction thereof becomes the same, and that the coil lead of each spiral coil includes a portion extending between the coil leads of the other spiral coils, so that the spiral coils thus disposed constitute a single inductor, and the outer end portions 51a, 52a, 53a and the inner end portions 51b, 52b, 53b of the spiral coils 51 to 53 are respectively fixed to the substrate S via the conductive columns 54A to 54F. Such configuration facilitates securing high strength of the spiral coils, which are spaced from the substrate. Whereas a higher strength can generally be secured by reducing the distance between a pair of columns fixing the spiral coil to the substrate, the coil unit U8 according to the present invention substantially forms a single spiral coil having an overall length of L and the number of turns of N (in this embodiment, N=4.5), from the three spiral coils having an overall length of L/3 and the number of turns of N/3. Thus, the inductor element X2 allows forming a relatively long spiral coil, hence an inductor, by combining three relatively short spiral coils, which are advantageous for securing required strength. The inductor element X2, which facilitates securing higher strength of the spiral coils, permits increasing the diameter, as well as the number of turns of the spiral coils, thereby facilitating increasing the Q value.

Thus, the inductor element X1 facilitates achieving a higher Q value.

Figure 24:
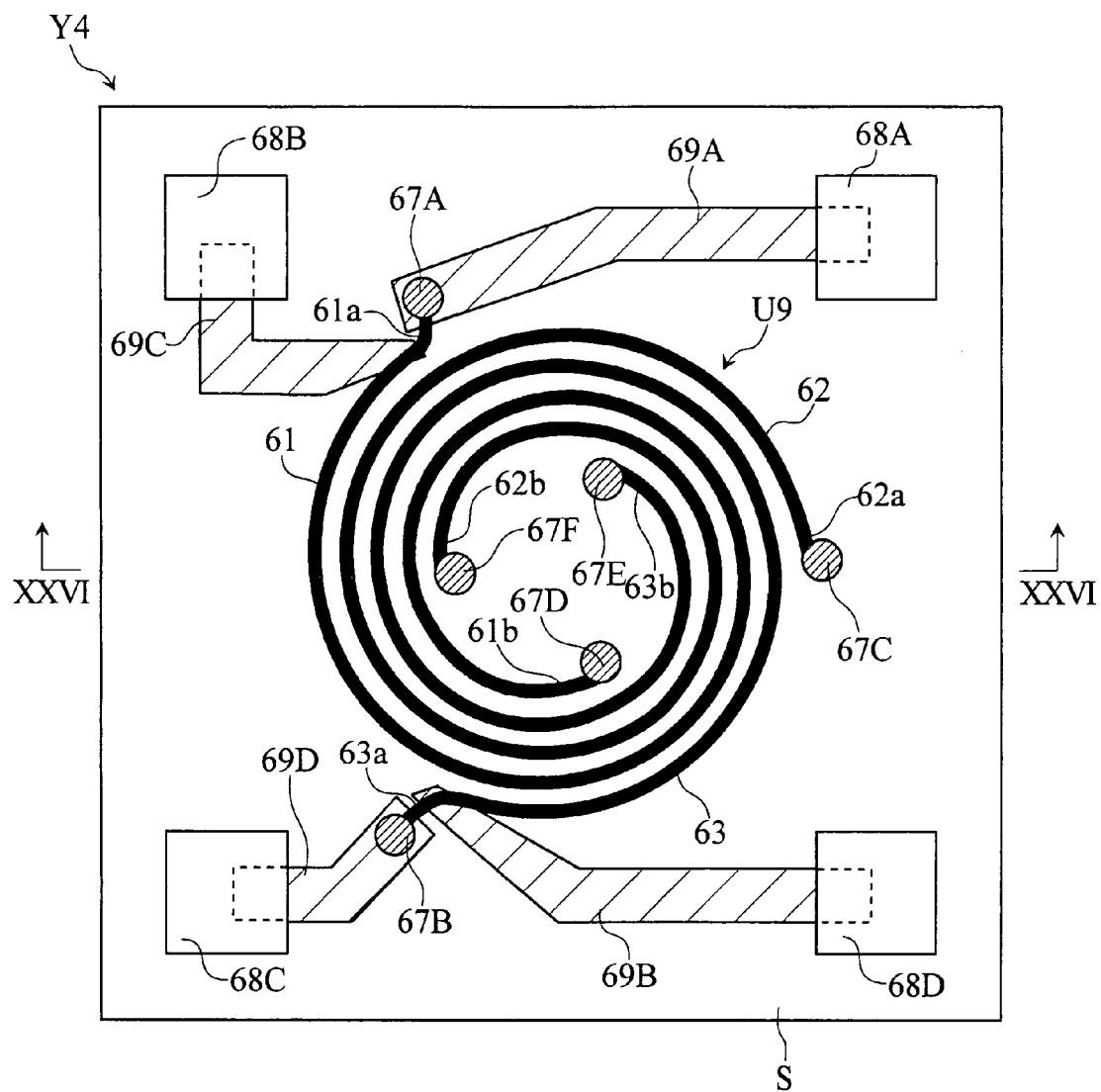
FIG. 24 is a plan view showing an integrated electronic component according to a sixth embodiment of the present invention.
Figure 25:
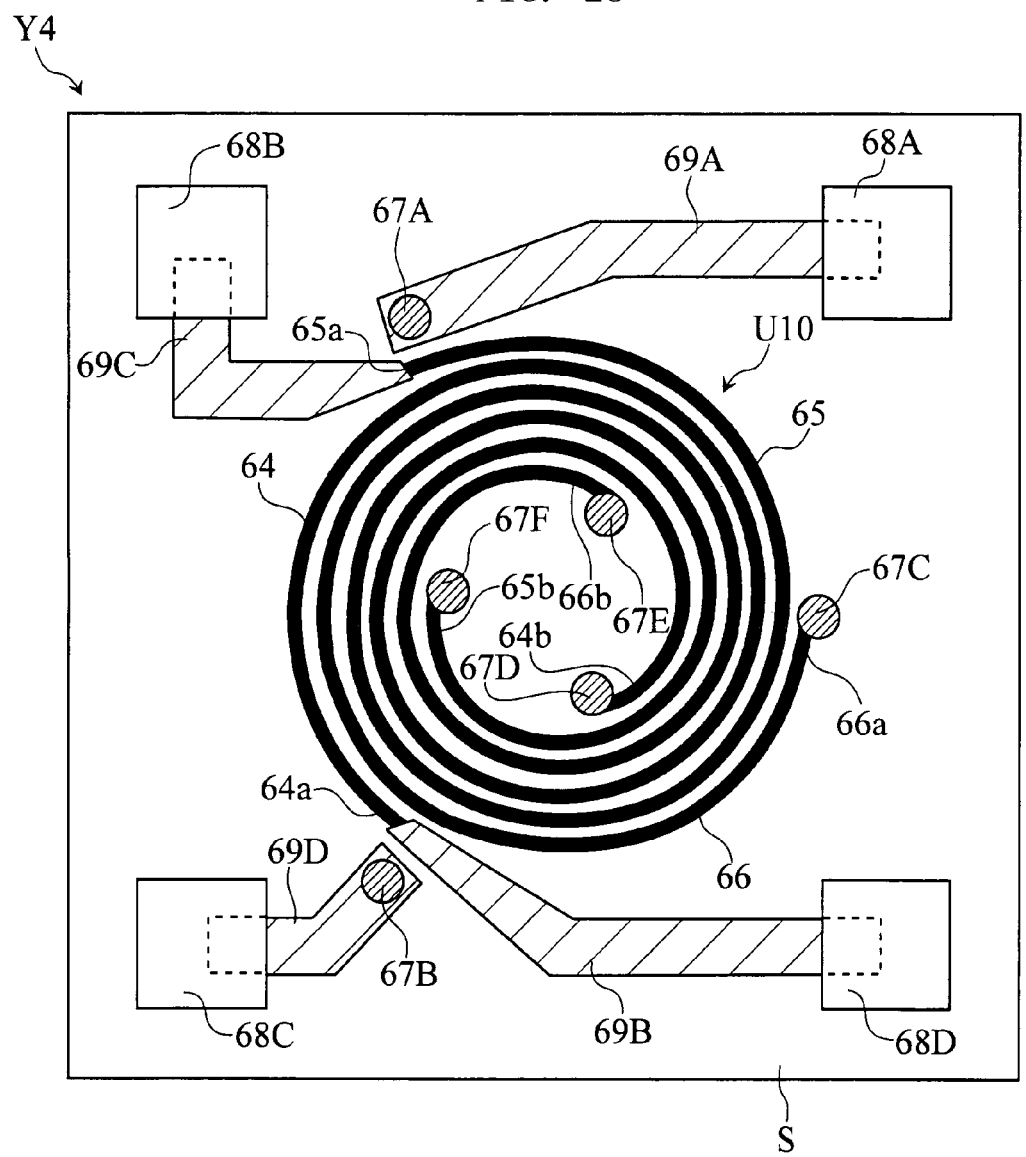
FIG. 25 is a fragmentary plan view of the integrated electronic component shown in FIG. 24.
Figure 26:
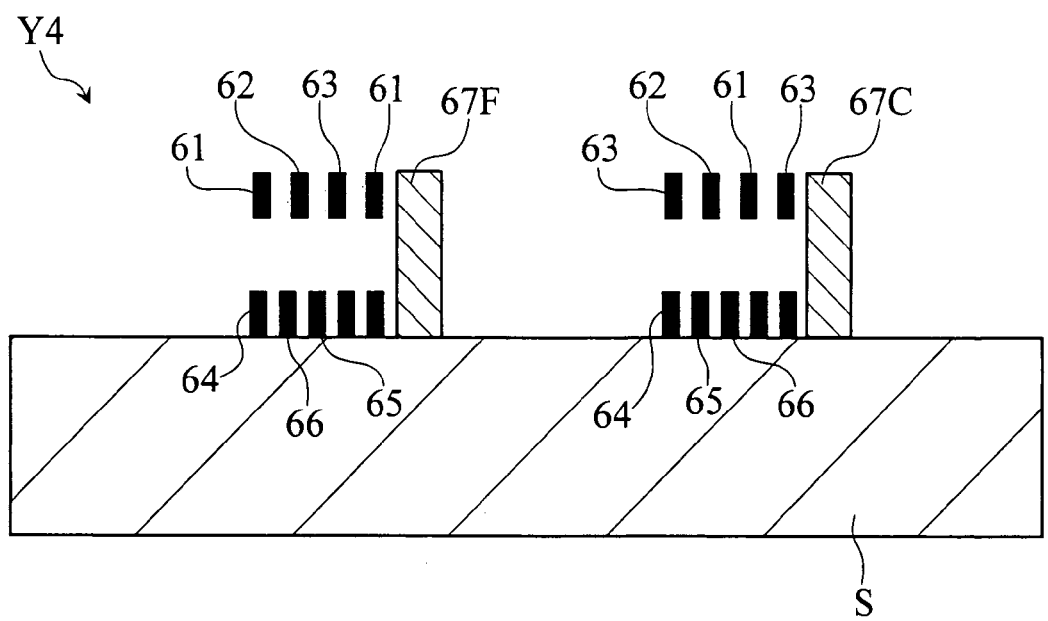
FIG. 26 is a cross-sectional view taken along a line XXVI-XXVI in FIG. 24.

FIGS. 24 to 26 illustrate an integrated electronic component Y4 according to a sixth embodiment of the present invention. FIG. 24 is a plan view of the integrated electronic component Y4. FIG. 25 is a fragmentary plan view of the integrated electronic component Y4. FIG. 26 is a cross-sectional view taken along a line XXVI-XXVI in FIG. 24.

Figure 27:
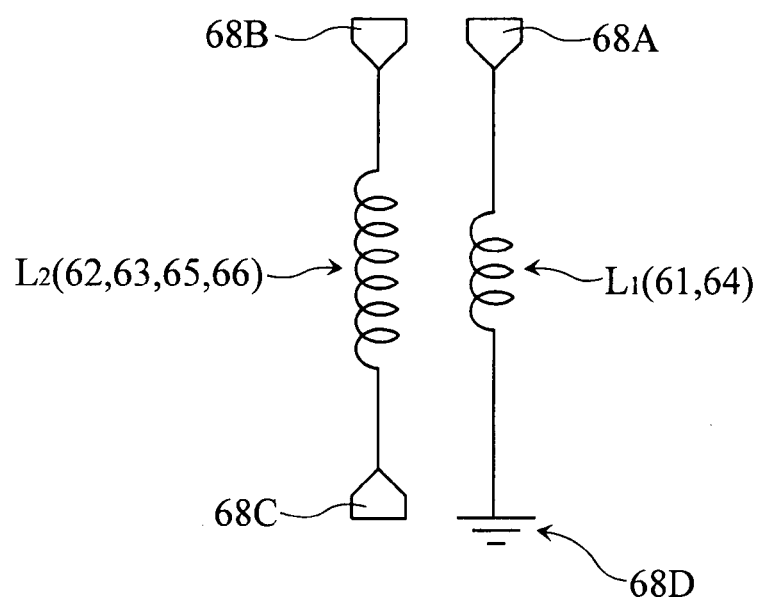
FIG. 27 is a circuit diagram of the integrated electronic component shown in FIG. 24.

The integrated electronic component Y4 includes a substrate S, a coil unit U9 (not shown in FIG. 25), a coil unit U10, conductive columns 67A, 67B, 67C, 67D, 67E, 67F, pads 68A, 68B, 68C, 68D, and interconnects 69A, 69B, 69C, 69D, and may be expressed as the circuit diagram shown in FIG. 27.

The coil unit U9 includes three spiral coils 61, 62, 63 located with a spacing from the substrate S. As shown in FIG. 24, the spiral coil 61 includes a spiral-shaped coil lead, with an outer end portion 61a and an inner end portion 61b. The spiral coil 62 includes a spiral-shaped coil lead, with an outer end portion 62a and an inner end portion 62b. The spiral coil 63 includes a spiral-shaped coil lead, with an outer end portion 63a and an inner end portion 63b. The spiral coils 61 to 63 are disposed such that the winding direction of the spiral coils 61 to 63 becomes the same, and that the coil lead of each spiral coil includes a portion extending between the coil leads of the other spiral coils. The outer end portions 61a, 62a, 63a and the inner end portions 61b, 62b, 63b of the spiral coils 61 to 63 are respectively fixed to the substrate S via the conductive columns 67A to 67F. The spiral coils 61 to 63 and the conductive columns 67A to 67F are constituted of, for example, Cu, Au, Ag, or Al. The spacing between the spiral coils 61 to 63 and the substrate S is, for example, 1 to 100 μm. The spiral coils 61 to 63 are constituted of, for example, Cu, Au, Ag, or Al. For the sake of simplicity, FIG. 24 excludes most of the components actually provided right under the coil unit U9 on the substrate S.

As shown in FIG. 25, the coil unit U10 includes three spiral coils 64, 65, 66 patterned on the substrate S. The spiral coil 64 includes a spiral-shaped coil lead, with an outer end portion 64a and an inner end portion 64b. The spiral coil 65 includes a spiral-shaped coil lead, with an outer end portion 65a and an inner end portion 65b. The spiral coil 66 includes a spiral-shaped coil lead, with an outer end portion 66a and an inner end portion 66b. The spiral coils 64, 65, 66 are disposed such that the winding direction of the spiral coils 64, 65, 66 becomes the same, and that the coil lead of one of the spiral coils includes a portion extending between the coil lead of the other spiral coil. The winding direction of the spiral coils 64, 65, 66 of the coil unit U10 is opposite to that of the spiral coils 61 to 63 of the coil unit U9. The inner end portion 64b of the spiral coil 64 is connected to the conductive column 67D. The inner end portion 65b of the spiral coil 65 is connected to the conductive column 67F. The outer end portion 66a of the spiral coil 66 is connected to the conductive column 67C, and the inner end portion 66b to the conductive column 67E. The spiral coils 64 to 66 are, for example, constituted of Cu, Au, Ag, or Al.

The pads 68A to 68D are electric pads for external connection. In this embodiment, the pad 68A is a terminal for inputting an electrical signal; the pads 68B, 68C are terminals for outputting an electrical signal; and the pad 68D is grounded. The pads 68A to 68D are constituted of, for example, a Ni body coated with Au on its upper surface.

Figure 28:
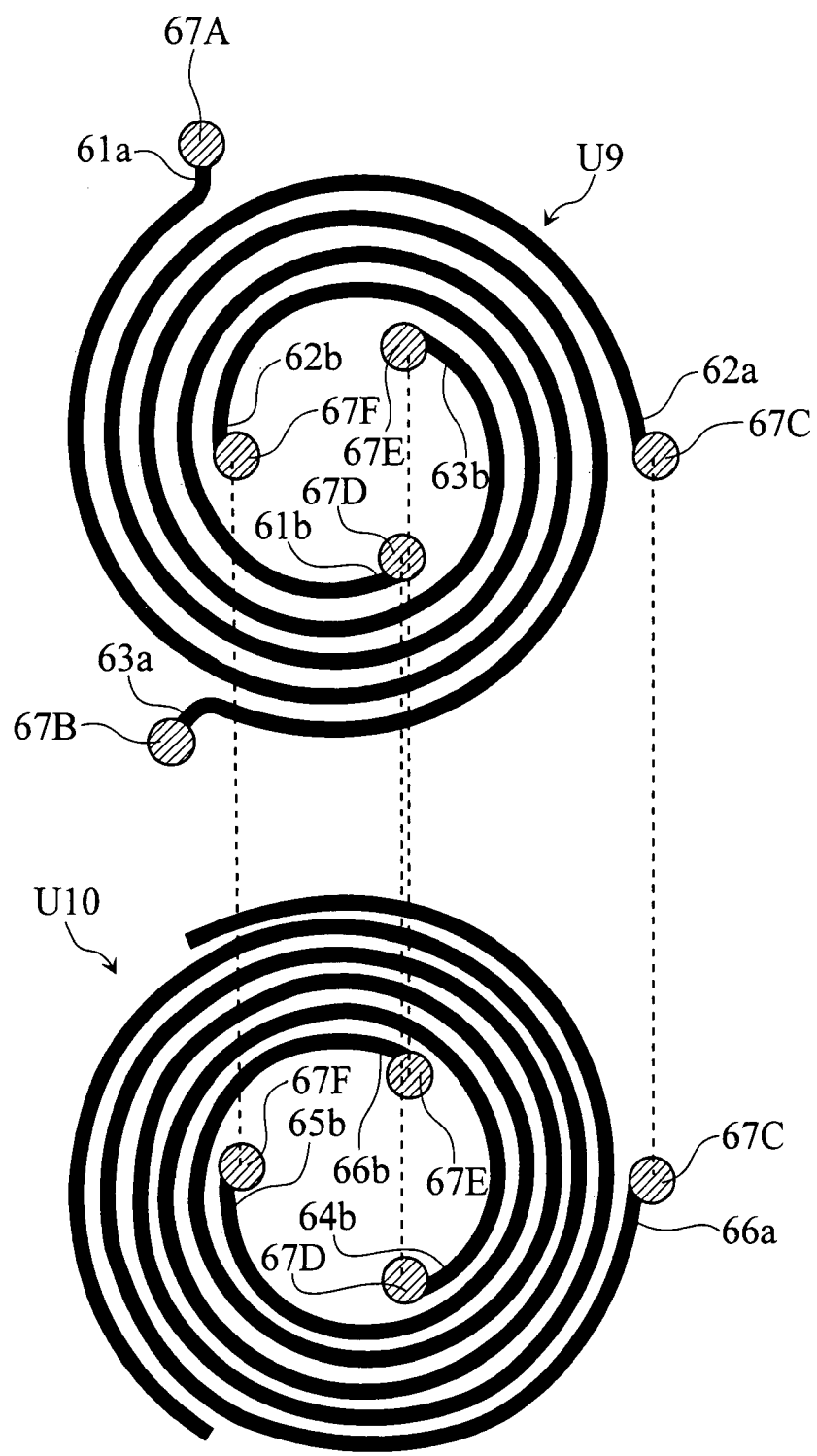
FIG. 28 is an exploded plan view of a coil unit according to the sixth embodiment.

As shown in FIG. 24, the pad 68A is electrically connected to the outer end portion 61a of the spiral coil 61 in the coil unit U9, via the interconnect 69A and the conductive column 67A. As is apparent from FIG. 28, which is an exploded plan view of the coil units U9, U10, the inner end portion 61b of the spiral coil 61 is electrically connected to the inner end portion 64b of the spiral coil 64 in the coil unit U10, via the conductive column 67D. The outer end portion 64a of the spiral coil 64 is electrically connected to the pad 68D, via the interconnect 69B. The pad 68B is electrically connected to the outer end portion 65a of the spiral coil 65 in the coil unit 10, via the interconnect 69C. The inner end portion 65b of the spiral coil 65 is electrically connected to the inner end portion 62b of the spiral coil 62 in the coil unit U9, via the conductive column 67F. The outer end portion 62a of the spiral coil 62 is electrically connected to the outer end portion 66a of the spiral coil 66 in the coil unit 10, via the conductive column 67C. The inner end portion 66b of the spiral coil 66 is electrically connected to the inner end portion 63b of the spiral coil 63 in the coil unit U9, via the conductive column 67E. The outer end portion 63a of the spiral coil 63 is electrically connected to the pad 68C, via the conductive column 67B and the interconnect 69D.

In the coil units U6, U7 of the integrated electronic component Y4 thus configured, the spiral coil 61 having 1.5 turns and the spiral coil 64 having 1.83 turns are serially connected, thereby constituting a coil inductor $L_1$ having 3.33 turns in total shown in FIG. 27. Likewise, the spiral coils 62, 63 each having 1.5 turns and the spiral coils 65, 66 each having 1.83 turns are serially connected, thereby constituting a coil inductor $L_2$ having 6.66 turns in total shown in FIG. 27. The coil inductors $L_1$, $L_2$ are isolated as shown in FIG. 27. In the spiral coils 61 to 66 thus configured, the current runs in the same direction when the power is on.

In the integrated electronic component Y4, the dielectric material is present neither between the coil leads of the coil unit U9 (spiral coils 61 to 63), nor between the coil leads of the coil unit U10 (spiral coils 64 to 66). Moreover, the spiral coils 61 to 63 are spaced from the substrate S including the dielectric material at least on the outermost layer thereof. In other words, the mutually adjacent coil leads in the spiral coils 61 to 63 are spaced from the dielectric material. Further, the dielectric material is not present between the coil unit U9 including the spiral coils 61 to 63 and the coil unit U10 including the spiral coils 64 to 66. The integrated electronic component Y4 can, therefore, suppress emergence of parasitic capacitance. Such integrated electronic component Y4 contributes to achieving a higher Q value.

As already stated, in the spiral coils 61 to 66 in the integrated electronic component Y4, the current runs in the same direction when the power is on. Such arrangement is desirable for gaining mutual inductance which contributes to increasing the overall inductance, with respect to the coil inductors $L_1$, $L_2$ shown in FIG. 27.

In the integrated electronic component Y4, two coil inductors $L_1$, $L_2$ are efficiently disposed on the substantially identical location on the substrate S. Such configuration facilitates reducing the dimensions of the integrated electronic component.

Figure 29:
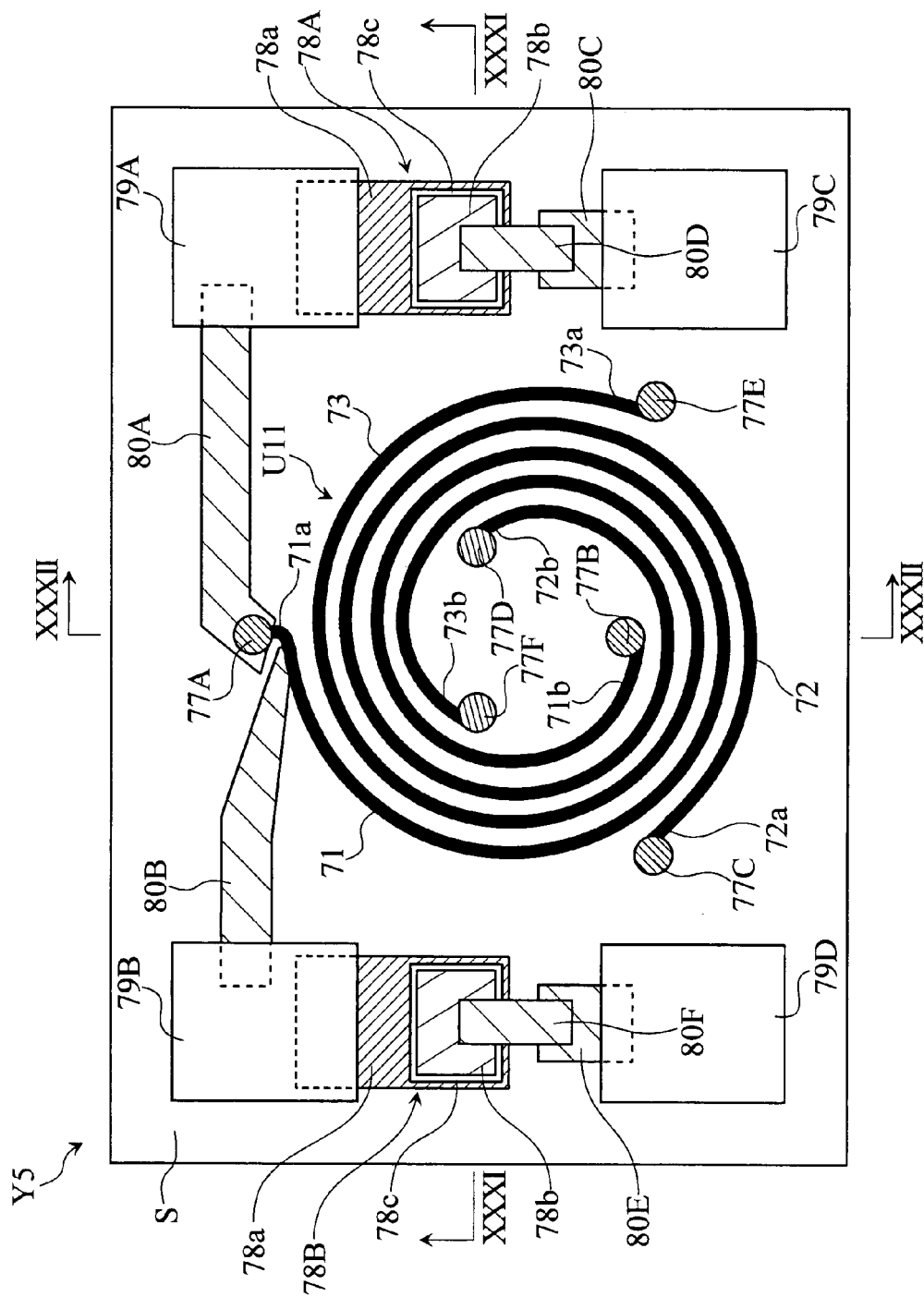
FIG. 29 is a plan view showing an integrated electronic component according to a seventh embodiment of the present invention.
Figure 30:
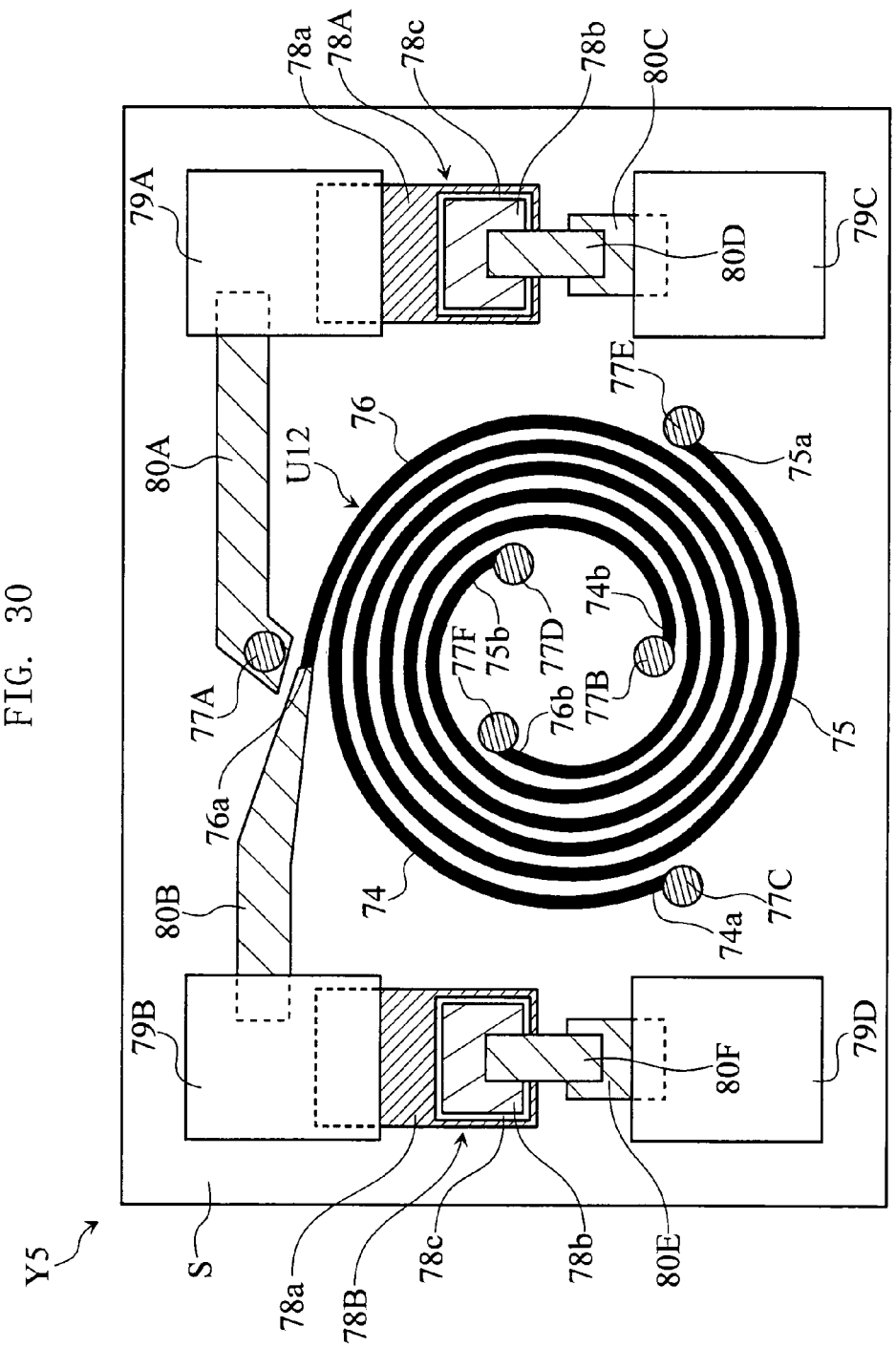
FIG. 30 is a fragmentary plan view of the integrated electronic component shown in FIG. 29.
Figure 31:
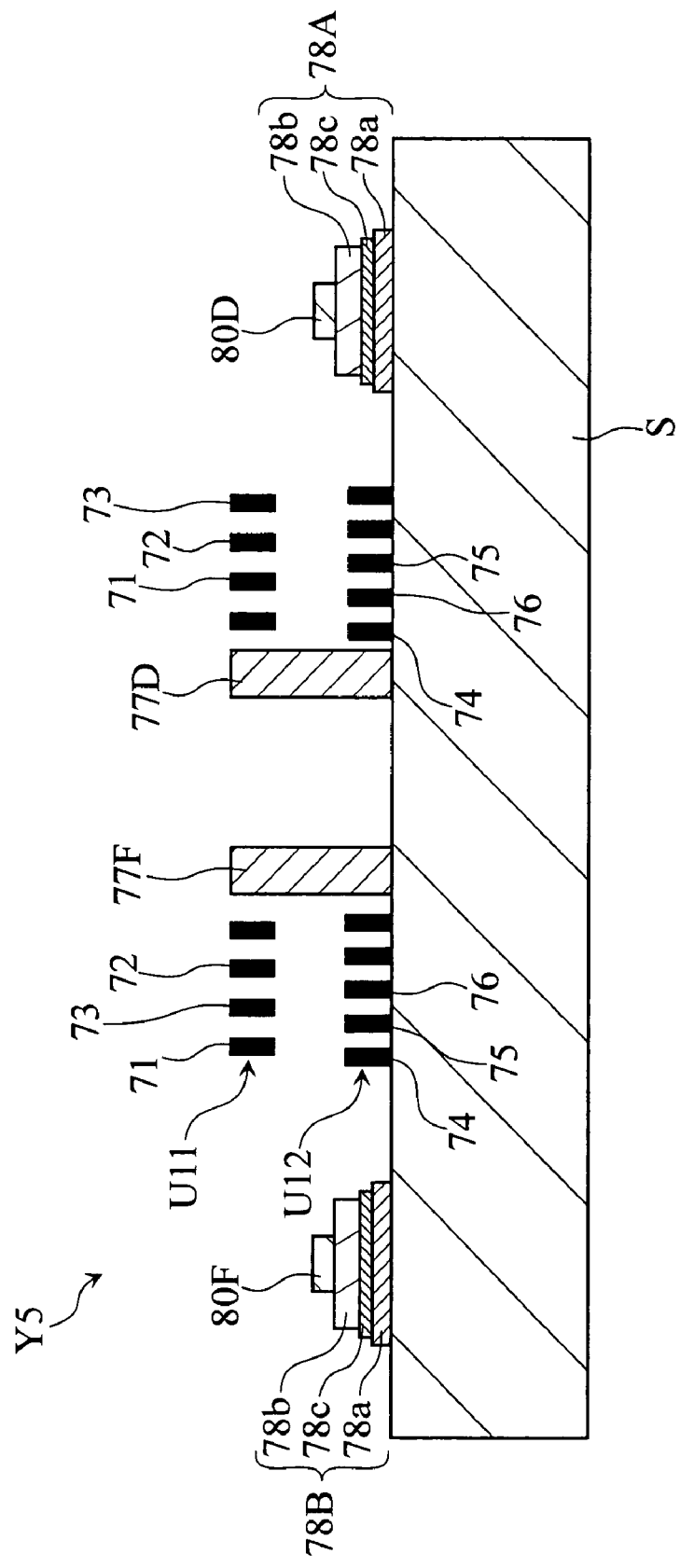
FIG. 31 is a cross-sectional view taken along a line XXXI-XXXI in FIG. 29.
Figure 32:
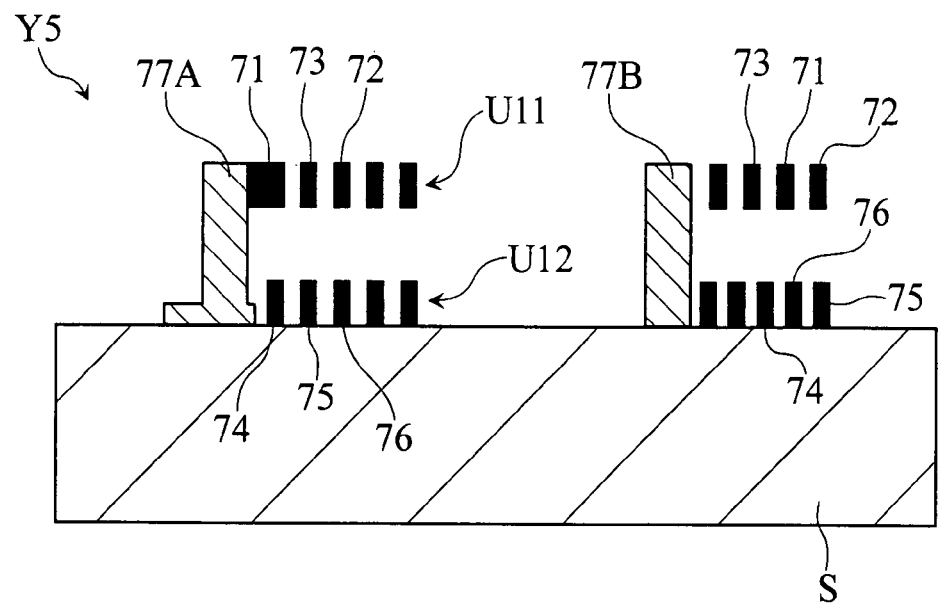
FIG. 32 is a cross-sectional view taken along a line XXXII-XXXII in FIG. 29.

FIGS. 29 to 32 illustrate an integrated electronic component Y5 according to a fifth embodiment of the present invention. FIG. 29 is a plan view of the integrated electronic component Y5. FIG. 30 is a fragmentary plan view of the integrated electronic component Y5. FIGS. 31 and 32 are cross-sectional views taken along a line XXXI-XXXI and XXXII-XXXII in FIG. 21, respectively.

Figure 33:
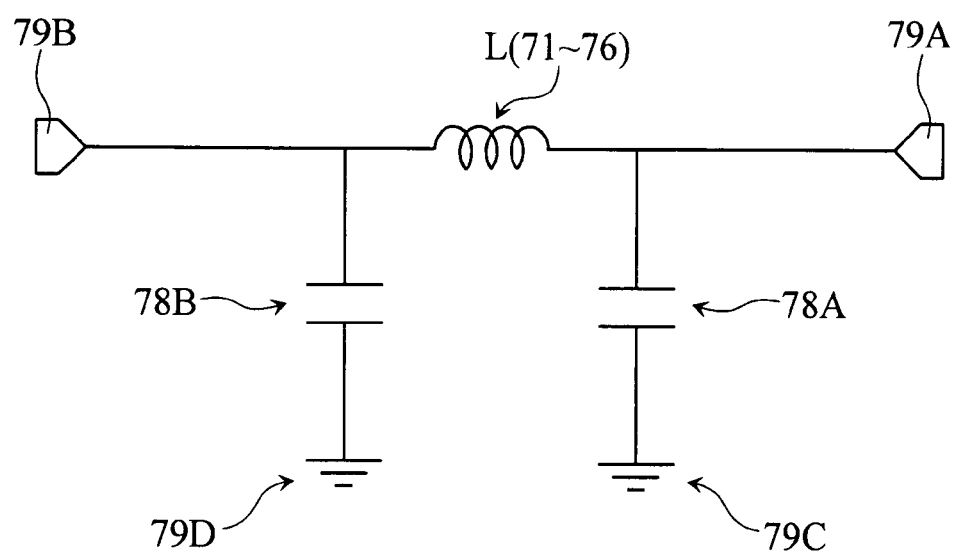
FIG. 33 is a circuit diagram of the integrated electronic component shown in FIG. 29.

The integrated electronic component Y5 includes a substrate S, a coil unit U11 (not shown in FIG. 30), a coil unit U12, conductive columns 77A, 77B, 77C, 77D, 77E, 77F, capacitors 78A, 78B, pads 79A, 79B, 79C, 79D, and interconnects 80A, 80B, 80C, 80D, 80E, 80F, and may be expressed as the circuit diagram shown in FIG. 33.

The coil unit U11 includes three spiral coils 71, 72, 73 located with a spacing from the substrate S. As shown in FIG. 29, the spiral coil 71 includes a spiral-shaped coil lead, with an outer end portion 71a and an inner end portion 71b. The spiral coil 72 includes a spiral-shaped coil lead, with an outer end portion 72a and an inner end portion 72b. The spiral coil 73 includes a spiral-shaped coil lead, with an outer end portion 73a and an inner end portion 73b. The spiral coils 71 to 73 are disposed such that the winding direction of the spiral coils 71 to 73 becomes the same, and that the coil lead of each spiral coil includes a portion extending between the coil leads of the other spiral coils. The outer end portions 71a, 72a, 73a and the inner end portions 71b, 72b, 73b of the spiral coils 71 to 73 are respectively fixed to the substrate S via the conductive column 77A to 77F. The spiral coils 71 to 73 and the conductive columns 77A to 77F are constituted of, for example, Cu, Au, Ag, or Al. The spacing between the spiral coils 71 to 73 and the substrate S is, for example, 1 to 100 μM. The spiral coils 71 to 73 are constituted of, for example, Cu, Au, Ag, or Al. For the sake of simplicity, FIG. 29 excludes most of the components actually provided right under the coil unit U11 on the substrate S.

As shown in FIG. 30, the coil unit U12 includes three spiral coils 74, 75, 76 patterned on the substrate S. The spiral coil 74 includes a spiral-shaped coil lead, with an outer end portion 74a and an inner end portion 74b. The spiral coil 75 includes a spiral-shaped coil lead, with an outer end portion 75a and an inner end portion 75b. The spiral coil 76 includes a spiral-shaped coil lead, with an outer end portion 76a and an inner end portion 76b. The spiral coils 74 to 76 are disposed such that the winding direction of the spiral coils 74 to 76 becomes the same, and that the coil lead of one of the spiral coils includes a portion extending between the coil lead of the other spiral coil. The winding direction of the spiral coils 74 to 76 of the coil unit U12 is opposite to that of the spiral coils 71 to 73 of the coil unit U11. The outer end portion 74a of the spiral coil 74 is connected to the conductive column 77C, and the inner end portion 74b to the conductive column 77B. The outer end portion 75a of the spiral coil 75 is connected to the conductive column 77E, and the inner end portion 75b to the conductive column 77D. The inner end portion 76b of the spiral coil 76 is connected to the conductive column 77F. The spiral coils 74 to 76 are, for example, constituted of Cu, Au, Ag, or Al.

The capacitors 78A, 78B respectively have, as is apparent from FIG. 31, a multilayer structure including a first electrode 78a and a second electrode 78b provided on the substrate S, and a dielectric layer 78c provided between the electrodes. The first electrode 78a, the second electrode 78b and the dielectric layer 78c may be constituted of similar materials to those cited regarding the first electrode 26a, the second electrode 26b, and the dielectric layer 26c of the foregoing embodiment.

The pads 79A to 79D are electric pads for external connection. In this embodiment, the pad 79A is a terminal for inputting an electrical signal; the pad 79B is a terminal for outputting an electrical signal; and the pads 79C, 79D are grounded. The pads 79A to 79D are constituted of, for example, a Ni body coated with Au on its upper surface.

Figure 34:
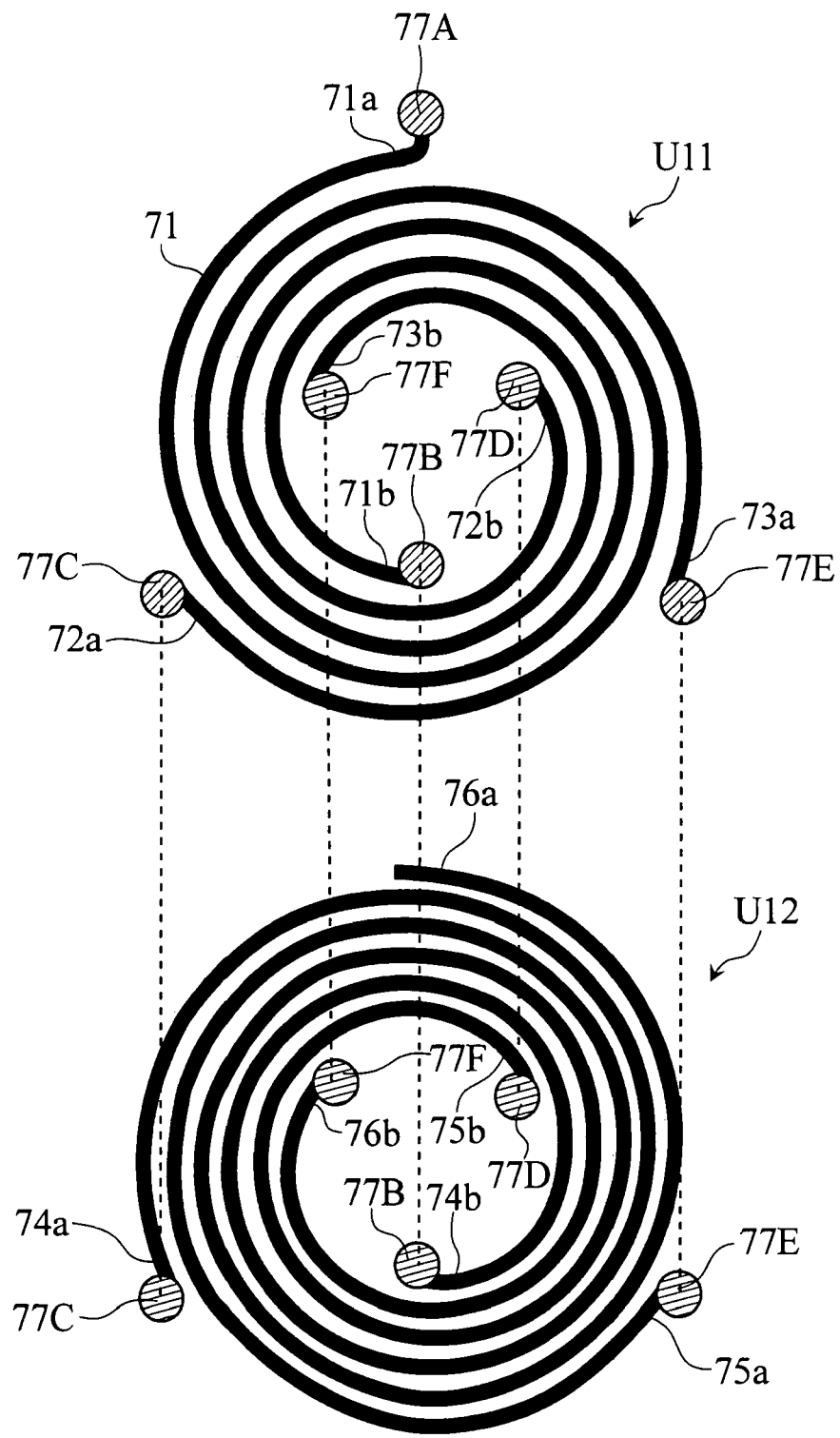
FIG. 34 is an exploded plan view of a coil unit according to the seventh embodiment.

As shown in FIG. 29, the pad 79A is electrically connected to the outer end portion 71a of the spiral coil 71 in the coil unit U11, via the interconnect 80A and the conductive column 77A. As is apparent from FIG. 34, which is an exploded plan view of the coil units U11, U12, the inner end portion 71b of the spiral coil 71 is electrically connected to the inner end portion 74b of the spiral coil 74 in the coil unit U12, via the conductive column 77B. The outer end portion 74a of the spiral coil 74 is electrically connected to the outer end portion 72a of the spiral coil 72 in the coil unit U11, via the conductive column 77C. The inner end portion 72b of the spiral coil 72 is electrically connected to the inner end portion 75b of the spiral coil 75 in the coil unit 12, via the conductive column 77D. The outer end portion 75a of the spiral coil 75 is electrically connected to the outer end portion 73a of the spiral coil 73 in the coil unit U11, via the conductive column 77E. The inner end portion 73b of the spiral coil 73 is electrically connected to the inner end portion 76b of the spiral coil 76 in the coil unit 12, via the conductive column 77F. The outer end portion 76a of the spiral coil 76 is electrically connected to the pad 79B, via the interconnect 80B. The pad 79C is electrically connected to the second electrode 78b of the capacitor 78A, via the interconnects 80C, 80D. The pad 79D is electrically connected to the second electrode 78b of the capacitor 78B, via the interconnects 80E, 80F.

In the coil units U11, U12 of the integrated electronic component Y5 thus configured, the spiral coils 71 to 73 each having 1.5 turns and the spiral coils 74 to 76 each having 1.83 turns are all serially connected, thereby constituting a coil inductor $L_1$ having 10 turns in total shown in FIG. 33. In the spiral coils 71 to 76 thus configured, the current runs in the same direction when the power is on.

In the integrated electronic component Y5, the dielectric material is present neither between the coil leads of the coil unit U11 (spiral coils 71 to 73), nor between the coil leads of the coil unit U12 (spiral coils 74 to 76). Moreover, the spiral coils 71 to 73 are spaced from the substrate S including the dielectric material at least on the outermost layer thereof. In other words, the mutually adjacent coil leads in the spiral coils 71 to 73 are spaced from the dielectric material. Further, the dielectric material is not present between the coil unit U11 including the spiral coils 71 to 73 and the coil unit U12 including the spiral coils 74 to 76. The integrated electronic component Y5 can, therefore, suppress emergence of parasitic capacitance. Such integrated electronic component Y5 contributes to achieving a higher Q value.

As already stated, in the spiral coils 71 to 76 in the integrated electronic component Y5, the current runs in the same direction when the power is on. Such arrangement is desirable for gaining larger inductance, with respect to the coil inductor L shown in FIG. 33.

The foregoing inductor elements X1, X2 and the integrated electronic components Y1 to Y5 may all be manufactured through a so-called micro-electromechanical systems (MEMS) technique.

In the first through the seventh embodiments, the spiral coils of the respective coil units spaced from the substrate S (coil unit U1, U2, U4, U6, U8, U9, U11) have the number of turns of 2.5 or 1.5, however different numbers of turns may be specified for the respective spiral coils according to the present invention. It is preferable, however, to set the number of turns as N+n (N is an integer, n is 0.3 to 0.5), from the viewpoint of the balance among the spiral coils.

Figure 35:
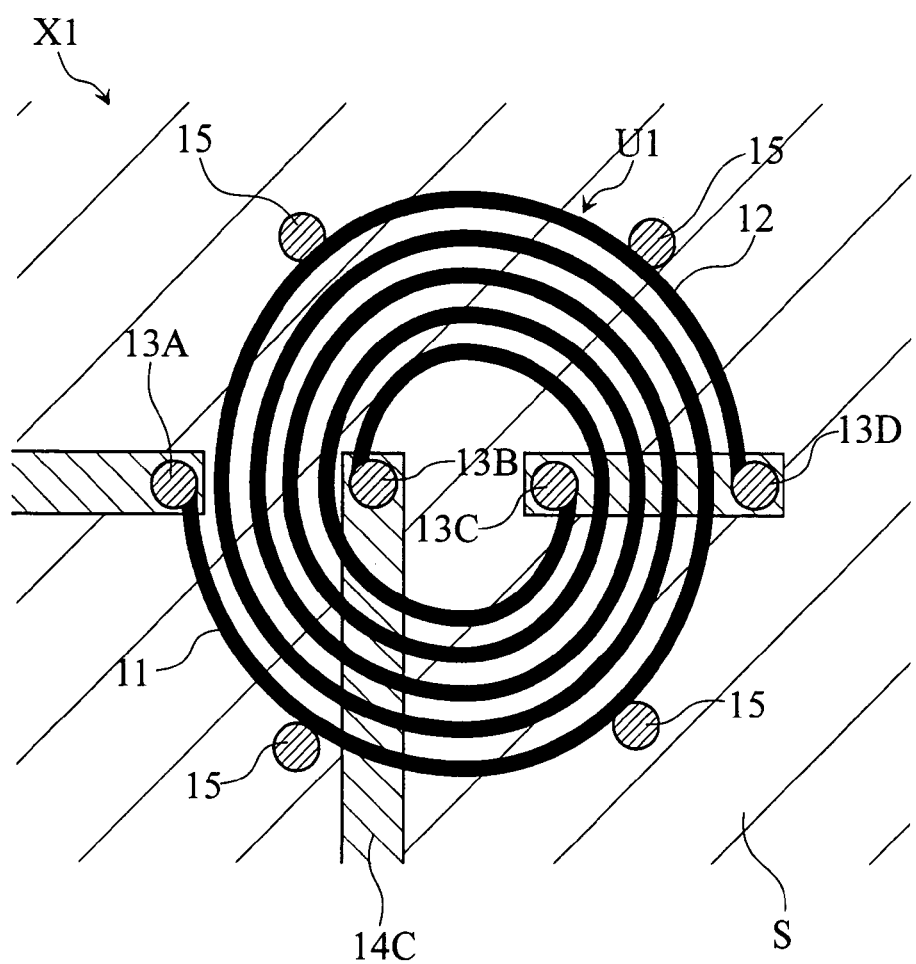
FIG. 35 is a plan view showing a coil unit spaced from a substrate with auxiliary columns.

In the first through the seventh embodiments, auxiliary columns may be provided for supporting and fixing the coil units spaced from the substrate S (coil unit U1, U2, U4, U6, U8, U9, U11) to the substrate S. FIG. 35 is a plan view of the inductor element X1 according to the first embodiment, to which four auxiliary columns 15 are additionally provided. In the inductor element X1 shown in FIG. 35, in which the coil unit U1 includes two spiral coils 11, 12, the spiral coil 11 is supported by two auxiliary columns 15 in addition to the conductive columns 13A, 13C, and the spiral coil 12 is supported by two auxiliary columns 15 in addition to the conductive columns 13B, 13D. Providing thus the auxiliary columns is desirable from the viewpoint of securing sufficient strength of the spiral coil, hence the coil unit.

Further, although the coil units U3, U5, U7, U10, U12 are patterned on the substrate S in the foregoing embodiments, those coil units or the respective spiral coils may be spaced from the substrate S, at a position between the respective mating coil unit (U2, U4, U6, U9, U11) and the substrate S, according to the present invention.

The invention claimed is:

1. An inductor element comprising:
   a substrate;
   a coil unit spaced from the substrate; and
   a plurality of conductive columns;
   wherein the coil unit includes a plurality of spiral coils each including a spiral-shaped coil lead,
   wherein the plurality of spiral coils are disposed such that the winding direction thereof becomes the same, and that the coil lead of each spiral coil includes a portion extending between the coil lead of at least one of the other spiral coils, and along the same,
   wherein end portions of each spiral coil are respectively fixed to the substrate via the conductive column.

2. The inductor element according to claim 1, wherein at least two spiral coils selected from the plurality of spiral coils are electrically connected such that a current runs in a same direction.

3. An inductor element comprising:
   a substrate;
   a first coil unit spaced from the substrate;
   a second coil unit between the substrate and the first coil unit, the second coil unit being spaced from the first coil unit; and
   a plurality of conductive columns;
   wherein the first coil unit includes a plurality of first spiral coils each including a spiral-shaped coil lead, the plurality of first spiral coils being disposed such that their winding direction is the same, and that the coil lead of each first spiral coil includes a portion extending among the coil lead of at least one of the other first spiral coils, each first spiral coil having end portions fixed to the substrate via the conductive column,
   wherein the second coil unit includes a plurality of second spiral coils each including a spiral-shaped coil lead, the plurality of second spiral coils being disposed such that their winding direction is the same, and that the coil lead of each second spiral coil includes a portion extending among the coil lead of at least one of the other second spiral coils, the winding direction of the second spiral coils being opposite to that of the first spiral coils,
   wherein at least one of the first spiral coils and at least one of the second spiral coils are electrically connected such that a current runs in a same direction.

4. The inductor element according to claim 3, wherein the second coil unit is disposed in contact with the substrate.

5. The inductor element according to claim 3, wherein the second coil unit is spaced from the substrate, and end portions of the second spiral coils of the second coil unit are respectively fixed to the substrate via the conductive column.

6. The inductor element according to claim 3, wherein the first spiral coils and the second spiral coils are all serially connected, so that a current runs in a same direction.

7. The inductor element according to claim 1 or 3, wherein a number of turns of each spiral coil is N+n, where N is an integer, n is 0.3 to 0.5.

8. The inductor element according to claim 1 or 3, further comprising an auxiliary column for fixing the coil unit to the substrate.

9. An integrated electronic component comprising the inductor element according to claim 1.

10. An integrated electronic component comprising the inductor element according to claim 3.

11. The integrated electronic component according to claim 10, wherein at least one of the first spiral coils and at least one of the second spiral coils are electrically connected to each other via a capacitor element.

* * * * *